United States Patent
Kim et al.

(10) Patent No.: US 9,474,145 B2
(45) Date of Patent: Oct. 18, 2016

(54) SUBSTRATE AND METHOD FOR MANUFACTURING SEMICONDUCTOR PACKAGE

(71) Applicants: JinGyu Kim, Asan-si (KR); Hyun Lee, Busan (KR)

(72) Inventors: JinGyu Kim, Asan-si (KR); Hyun Lee, Busan (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/729,028

(22) Filed: Jun. 2, 2015

(65) Prior Publication Data

US 2015/0382443 A1    Dec. 31, 2015

(30) Foreign Application Priority Data

Jun. 25, 2014  (KR) ........................ 10-2014-0078187

(51) Int. Cl.
| | |
|---|---|
| H01L 23/544 | (2006.01) |
| H05K 1/02 | (2006.01) |
| H01L 23/00 | (2006.01) |
| H01L 23/36 | (2006.01) |
| H01L 23/498 | (2006.01) |
| H01L 25/10 | (2006.01) |

(Continued)

(52) U.S. Cl.
CPC ............. *H05K 1/02* (2013.01); *H01L 21/561* (2013.01); *H01L 21/565* (2013.01); *H01L 23/36* (2013.01); *H01L 23/49811* (2013.01); *H01L 23/49838* (2013.01); *H01L 24/97* (2013.01); *H01L 25/105* (2013.01); *H01L 23/3121* (2013.01); *H01L 2224/16225* (2013.01); *H01L 2924/15311* (2013.01); *H01L 2924/181* (2013.01); *H01L 2924/18161* (2013.01)

(58) Field of Classification Search
CPC ...... H01L 23/13; H01L 23/3121; H05K 1/02
USPC .......................................................... 257/620
See application file for complete search history.

(56) References Cited

U.S. PATENT DOCUMENTS

| | | |
|---|---|---|
| 6,531,769 B2 | 3/2003 | Yamaguchi |
| 6,594,811 B2 | 7/2003 | Katz |

(Continued)

FOREIGN PATENT DOCUMENTS

| | | |
|---|---|---|
| JP | 4612441 B2 | 10/2010 |
| JP | 2012160766 A | 8/2012 |

(Continued)

OTHER PUBLICATIONS

Joshi M. et al., "Molded Under-Fill (MUF) Technology for Flip Chip Packages in Mobile Applications," STATS ChipPAC Inc., 2010 Electronic Components and Technology Conference (ECTC) Proceedings, pp. 1249-1257 (9 pages).

*Primary Examiner* — Luan C Thai
(74) *Attorney, Agent, or Firm* — Renaissance IP Law Group LLP

(57) ABSTRACT

A substrate for a semiconductor package and a method for manufacturing a semiconductor package are disclosed. The substrate comprises a surface, and package unit regions arranged on the surface in a row direction to form a plurality of rows. The package unit regions of an n+1-th row are arranged offset in a row direction from the package unit regions of an n-th row. The method includes molding semiconductor chips and spaces between the substrate and the semiconductor chips on the package unit regions of the last row at substantially the same time.

21 Claims, 33 Drawing Sheets

(51) Int. Cl.
  *H01L 21/56*    (2006.01)
  *H01L 23/31*    (2006.01)

(56) References Cited

U.S. PATENT DOCUMENTS

| | | | |
|---|---|---|---|
| 6,707,164 B2 | 3/2004 | Cheng et al. | |
| 6,762,507 B2 | 7/2004 | Cheng et al. | |
| 6,921,981 B2 | 7/2005 | Tien | |
| 7,030,469 B2 | 4/2006 | Mahadevan et al. | |
| 7,144,758 B2 | 12/2006 | Yuzawa | |
| 7,345,361 B2* | 3/2008 | Mallik | H01L 23/49816 228/180.1 |
| 7,371,613 B2* | 5/2008 | Shimanuki | H01L 21/561 257/E21.499 |
| 7,372,169 B2 | 5/2008 | Chang | |
| 7,525,180 B2 | 4/2009 | Ochi | |
| 7,723,157 B2 | 5/2010 | Lee et al. | |
| 7,768,112 B2 | 8/2010 | Lee et al. | |
| 7,825,527 B2 | 11/2010 | Bereza et al. | |
| 7,879,653 B2 | 2/2011 | Lin | |
| 8,012,797 B2* | 9/2011 | Shen | H01L 21/4853 438/107 |
| 8,076,763 B2 | 12/2011 | Thoonen | |
| 8,093,708 B2 | 1/2012 | Lovskog | |
| 8,482,109 B2 | 7/2013 | Camacho et al. | |
| 8,487,451 B2* | 7/2013 | Nondhasitthichai | H01L 21/568 257/777 |
| 8,508,954 B2* | 8/2013 | Kwon | H01L 21/561 361/774 |
| 8,569,898 B2 | 10/2013 | Takeda et al. | |
| 8,592,997 B2 | 11/2013 | Yu et al. | |
| 2001/0045636 A1 | 11/2001 | Yamaguchi | |
| 2002/0060318 A1 | 5/2002 | Katz | |
| 2003/0075812 A1 | 4/2003 | Cheng et al. | |
| 2003/0127731 A1 | 7/2003 | Tien | |
| 2004/0004278 A1 | 1/2004 | Cheng et al. | |
| 2005/0009240 A1 | 1/2005 | Yuzawa | |
| 2005/0067676 A1 | 3/2005 | Mahadevan et al. | |
| 2006/0056955 A1 | 3/2006 | Kim et al. | |
| 2007/0080456 A1 | 4/2007 | Chang | |
| 2007/0090565 A1 | 4/2007 | Ochi | |
| 2008/0119012 A1* | 5/2008 | Fan | H01L 21/561 438/112 |
| 2008/0315432 A1 | 12/2008 | Thoonen | |
| 2009/0166891 A1 | 7/2009 | Lee et al. | |
| 2009/0302446 A1 | 12/2009 | Lee et al. | |
| 2009/0309240 A1 | 12/2009 | Bereza et al. | |
| 2010/0178734 A1 | 7/2010 | Lin | |
| 2010/0289141 A1 | 11/2010 | Takeda et al. | |
| 2011/0001231 A1 | 1/2011 | Lovskog | |
| 2011/0193228 A1 | 8/2011 | Yu et al. | |
| 2012/0018866 A1 | 1/2012 | Camacho et al. | |
| 2012/0074586 A1* | 3/2012 | Seo | H01L 25/16 257/774 |
| 2013/0075883 A1 | 3/2013 | Camacho et al. | |
| 2013/0161800 A1* | 6/2013 | Byun | H01L 23/18 257/667 |
| 2014/0127883 A1 | 5/2014 | Sekiya | |

FOREIGN PATENT DOCUMENTS

| | | |
|---|---|---|
| KR | 20040092196 A | 11/2004 |
| KR | 100571515 B1 | 4/2006 |
| KR | 100968530 B1 | 7/2010 |
| KR | 20130119615 A | 11/2013 |

* cited by examiner

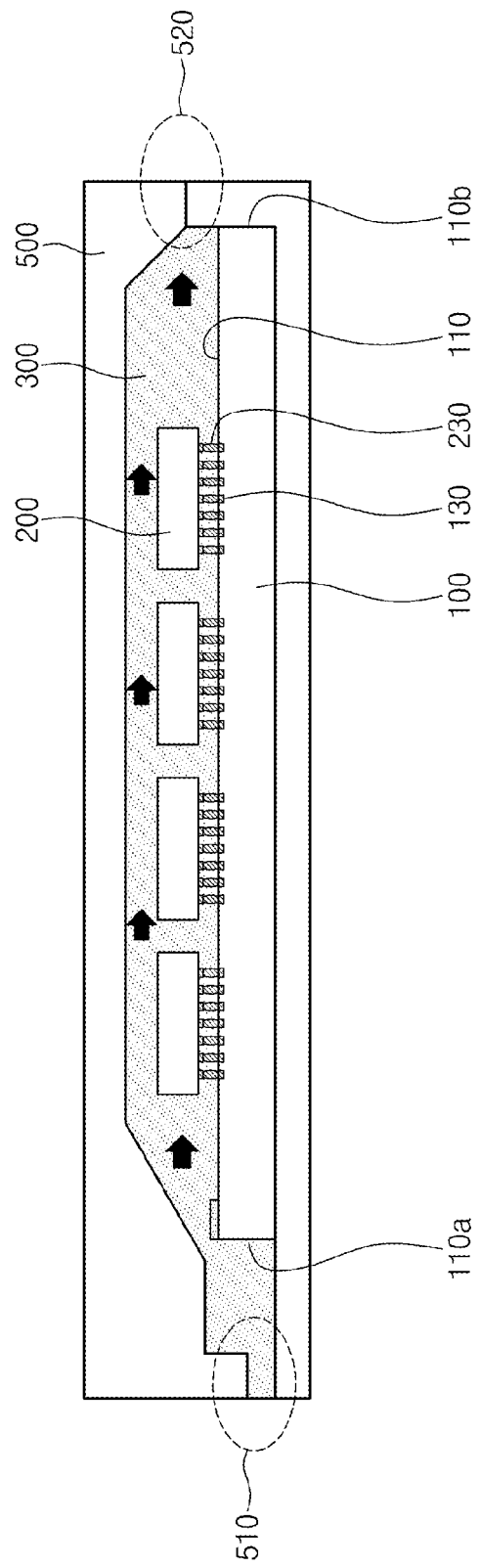

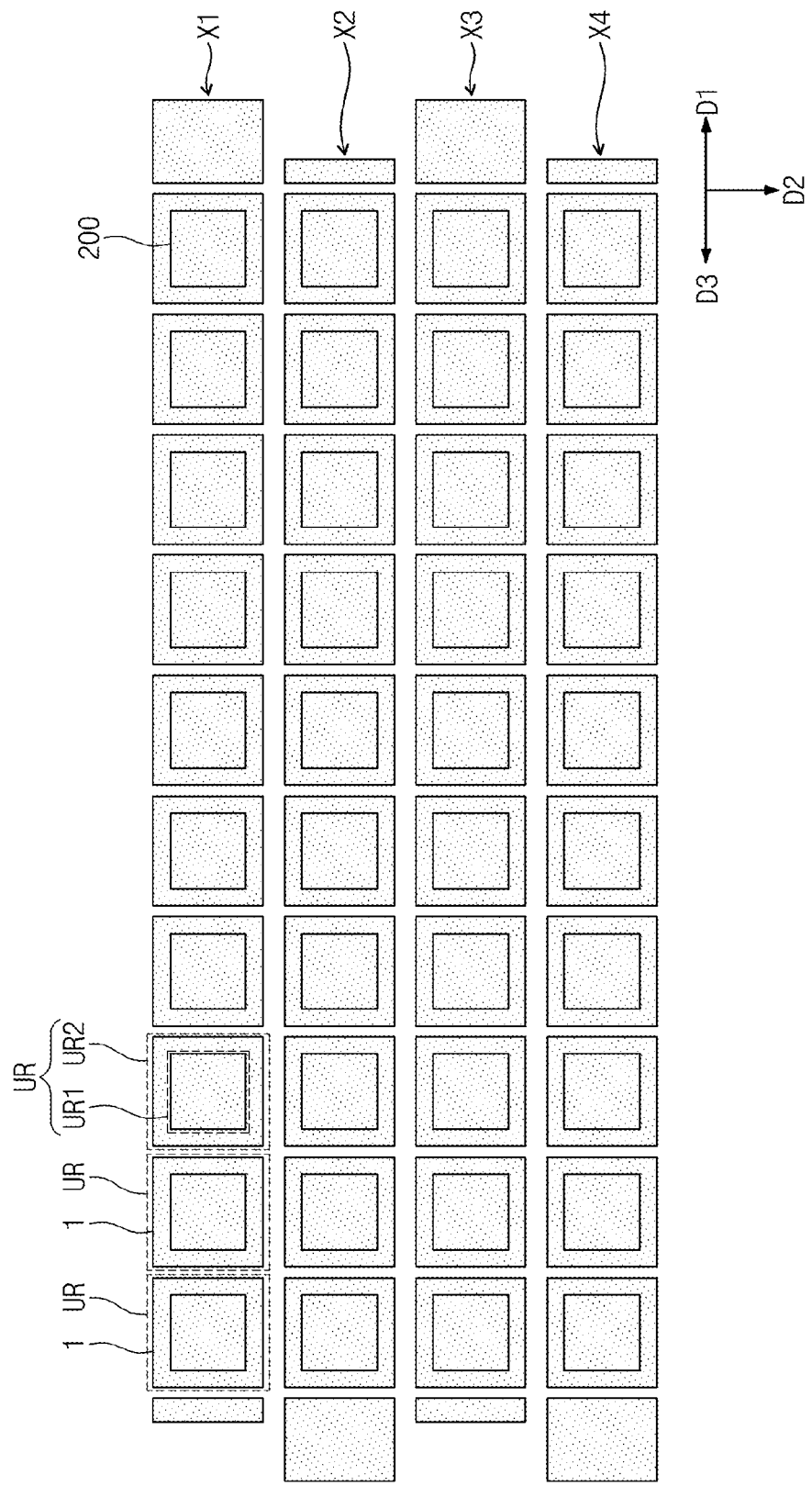

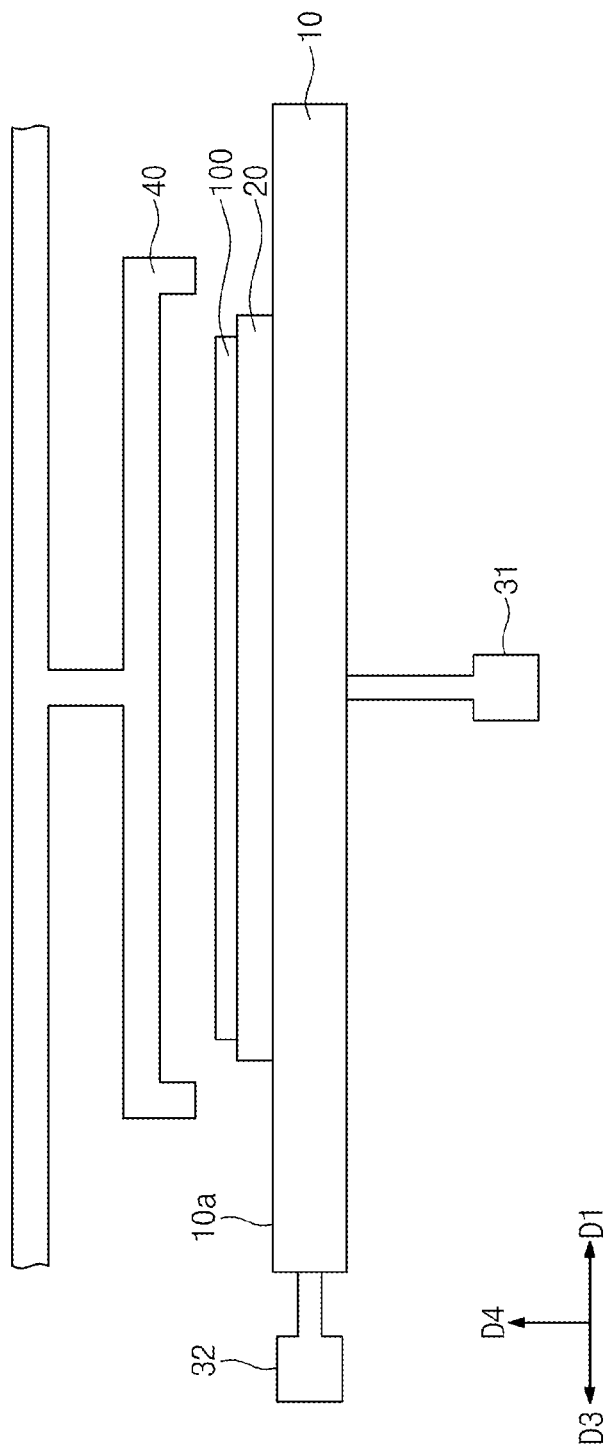

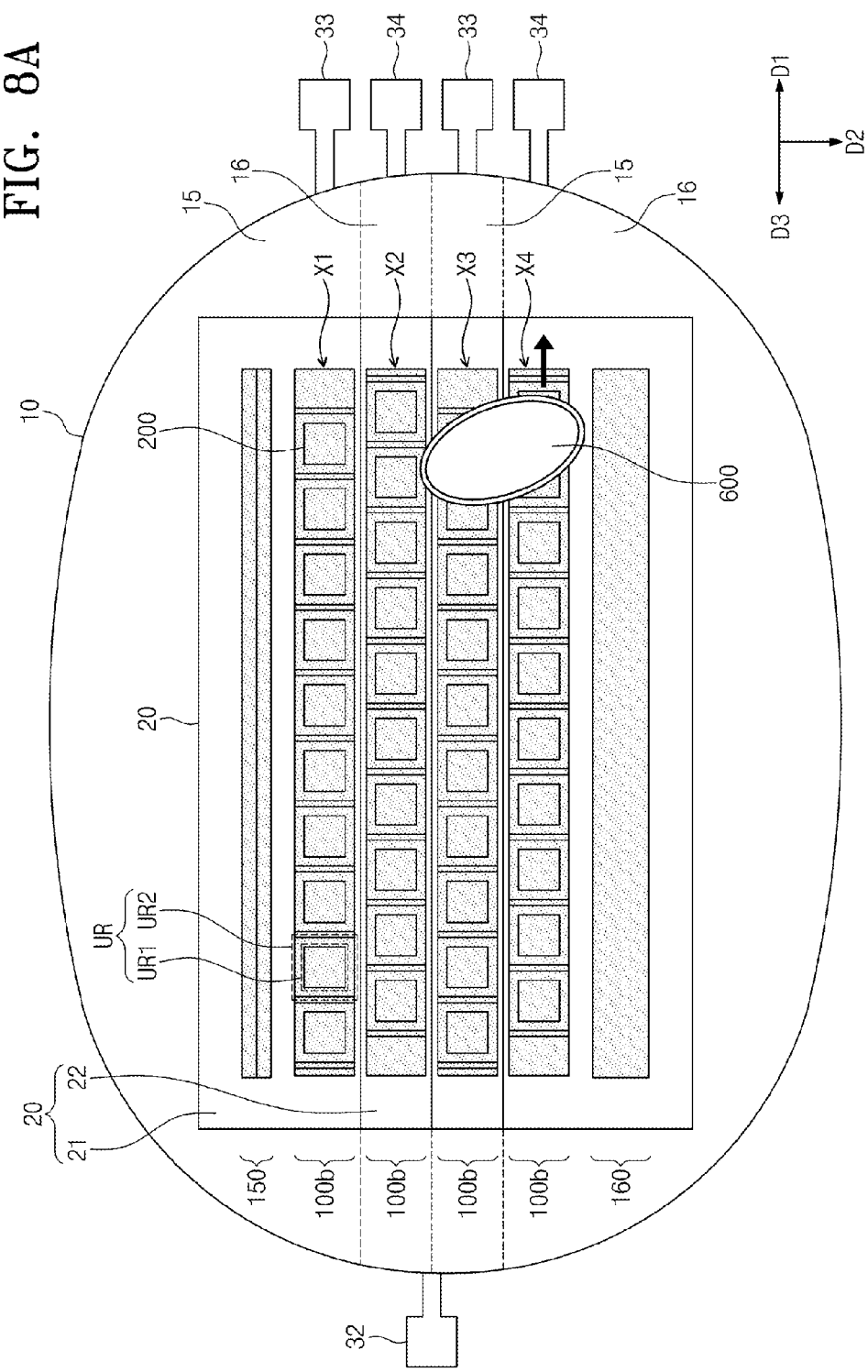

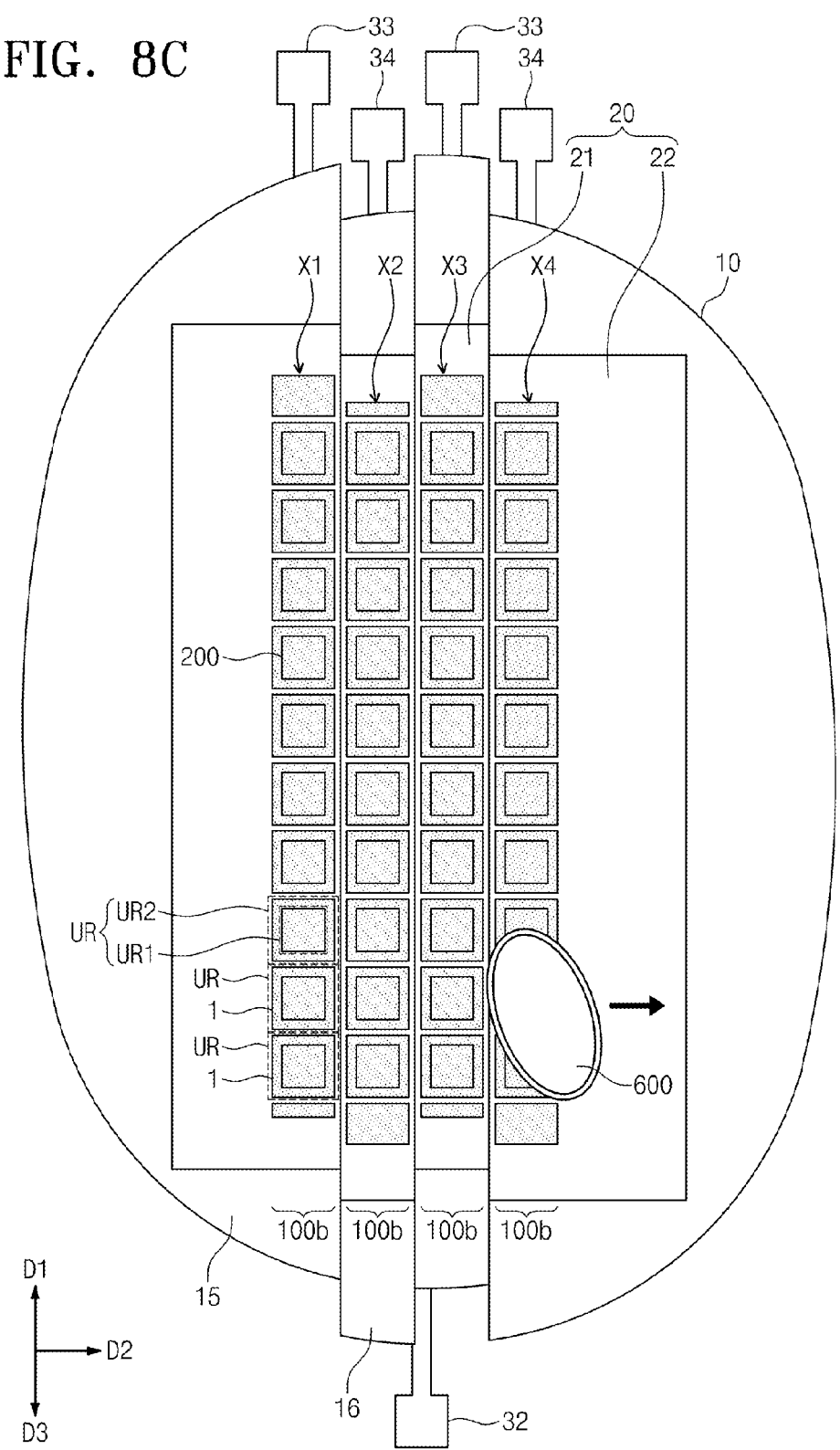

SUBSTRATE AND METHOD FOR MANUFACTURING SEMICONDUCTOR PACKAGE

CROSS-REFERENCE TO RELATED APPLICATION

This U.S. non-provisional patent application claims priority under 35 U.S.C. §119 to Korean Patent Application No. 10-2014-0078187, filed on Jun. 25, 2014, in the Korean Intellectual Property Office, the disclosure of which is hereby incorporated by reference in its entirety.

BACKGROUND

The subject matter disclosed herein relates to a semiconductor device. More particularly, the subject matter disclosed herein relates to a substrate for a semiconductor package and a method for manufacturing a semiconductor package using the same.

Generally, semiconductor integrated circuits used in electronic devices may be realized on semiconductor chips. As the semiconductor integrated circuits have been highly integrated, the number of electrode terminals of each semiconductor chip has been increased and a pitch of the electrode terminals has been reduced. The semiconductor chips may be encapsulated by a packaging technique to be used in the electronic devices. A semiconductor package including the semiconductor chip may generally use a printed circuit board. That is, the semiconductor chip may be mounted on the printed circuit board. The semiconductor chip may be mounted by a flip chip bonding technique using bumps that reduce signal delay.

SUMMARY

Embodiments disclosed herein may provide substrates capable of improving reliability of a semiconductor package.

Embodiments disclosed herein may also provide reliable semiconductor packages and method for manufacturing the same.

In one aspect, a substrate for a semiconductor package may include: a surface; and package unit regions arranged on the surface to form a plurality of rows that are parallel to a row direction. The package unit regions of an n+1-th row may be arranged offset in the row direction from the package unit regions of an n-th row, where "n" denotes a natural number.

In some embodiments, the package unit regions of the n-th row and the package unit regions of a row that is not adjacent to the n-th row may form columns. The columns may be perpendicular to the rows.

In some embodiments, a total number of package unit regions forming a row may be greater than a total number of rows.

In some embodiments, a total number of package unit regions of the n-th row may be equal to a total number of package unit regions of the row adjacent to the n-th row.

In some embodiments, a total number of package unit regions of the n-th row may be different from a total number of package unit regions of a row adjacent to the n-th row.

In some embodiments, each package unit regions may include: a chip region adapted to receive a semiconductor chip; and an edge region surrounding the chip region.

In some embodiments, a distance from a first side of the surface to the package unit regions of a first row may be less than a distance from a second side of the surface to the package unit regions of a last row. The first side may be opposite to the second side.

In another aspect, a substrate for a semiconductor package may include: a first surface; and a plurality of package unit regions arranged on the first surface to form a plurality of rows that are parallel to a row direction. Each of the package unit regions may include: a chip region; and an edge region surrounding the chip region. The package unit regions of a row may be respectively offset in the row direction from the package unit regions of an adjacent row.

In some embodiments, package unit regions of even-numbered rows may be arranged offset in the row direction from package unit regions of odd-numbered rows.

In some embodiments, a total number of package unit regions of a row may be equal to a total number of package unit regions of each other row.

In some embodiments, the package unit regions may be defined by first saw lines and second saw lines. The first saw lines may extend in the row direction, and the second saw lines may extend in a column direction intersecting the row direction.

In some embodiments, the chip regions of a row may be aligned with the second saw lines respectively separating the package unit regions of the row from each other in the column direction.

In some embodiments, the first and second saw lines may be recessed from the first surface.

In some embodiments, the substrate may further include: a second surface opposite to the first surface. Assistant saw lines may be provided on the second surface and may be disposed at positions corresponding to the first and second saw lines.

In some embodiments, a total number of the package unit regions of a row may be greater than a total number of rows.

In some embodiments, the rows may be parallel to a long axis of the first surface.

In some embodiments, each of the package unit regions may further include: a plurality of pads. The pads may be provided on the chip region and the edge region.

In still another aspect, a method for manufacturing a semiconductor package may include: providing a substrate including a plurality of package unit regions; mounting a plurality of semiconductor chips on the substrate in which each semiconductor chip is mounted on a respective package unit region; forming a molding layer covering the plurality of semiconductor chips on the substrate; and sawing the substrate to separate the package unit regions from each other. The package unit regions may be arranged along a plurality of rows on the substrate, and the package unit regions of one of the rows may be arranged offset in a direction parallel to the rows from the package unit regions of an adjacent row.

In some embodiments, each of the package unit regions may include: a chip region on which the corresponding semiconductor chip is mounted; and an edge region surrounding the chip region. Mounting the semiconductor chips may include: arranging the semiconductor chips such that the semiconductor chips of a row are arranged offset in the row direction from the semiconductor chips of the an adjacent row.

In some embodiments, a molding compound may be sequentially provided from a first row of the plurality of rows to a last row of the plurality of rows to form the molding layer to cover the package unit regions of the first row to the package unit regions of the last row. The chip regions and the edge regions of the law row may be molded at substantially the same time.

In some embodiments, the package unit regions of even-numbered rows may be arranged offset in the row direction from the package unit regions of odd-numbered rows.

In some embodiments, connecting elements may be provided between the substrate and the semiconductor chips, and the molding layer may extend between the substrate and the semiconductor chips to fill spaces between connecting elements.

In some embodiments, the substrate may further include: saw lines defining the package unit regions. The package unit regions of the one row may be respectively aligned in a direction substantially perpendicular to the row direction with the saw lines between package unit regions of another row.

In some embodiments, a semiconductor package substrate comprises a surface and a plurality of package unit regions arranged on the surface to form a plurality of rows in a first direction. The package units regions in a first row may be arranged offset in the first direction from the package units of a second row that is adjacent to the first row. The package unit regions in the first row and the package unit regions in a row that is not adjacent to the first row may form columns that are substantially perpendicular to the first direction. A total number of package unit regions forming a row may be greater than a total number of rows. Alternatively, a total number of package unit regions in the first row may be equal to a total number of package unit regions in the row adjacent to the first row. A total number of package unit regions in the first row may also be different from a total number of package unit regions in a row adjacent to the first row. Each package unit region may comprise a chip region adapted to receive a semiconductor chip, and an edge region surrounding the chip region. In some embodiments, the substrate may comprise a plurality of semiconductor chips in which each semiconductor chip is received by a corresponding chip region. In some embodiments, the surface may comprise a first side and a second side in which the second side is opposite the first side. A distance from the first side to the package unit regions of a row that is adjacent to the first side may be less than a distance from the second side to the package unit regions of a row that is adjacent to the second side. In some embodiments, the substrate may comprise a molding layer formed over and covering the semiconductor chips. In some embodiments, each package unit region may comprise a plurality of first pads in which each semiconductor chip may comprise a plurality of second pads and in which the plurality of second pads of a semiconductor chip may correspond to the plurality of first pads of a package unit region.

In some embodiments, a method for manufacturing a semiconductor package comprises: providing a substrate comprising a surface, in which the surface comprises a first side and a second side, in which the second side is opposite the first side, and in which the substrate further comprises a plurality of package unit regions, in which the package unit regions are arranged in a plurality of rows on the surface, the package unit regions of a row are arranged offset in a direction that is substantially parallel to a direction of the rows from the package unit regions of an adjacent row, and a first row being adjacent to the first side and a last row being adjacent to the second side; attaching a plurality of semiconductor chips to the surface, in which each semiconductor chip are attached to a corresponding package unit region; forming a molding layer covering the plurality of semiconductor chips on the surface by flowing the molding layer from the first side of the surface to the second side of the surface so that the semiconductor chips in the last row are each molded at substantially the same time; and separating the substrate to separate package unit regions from each other. In some embodiments, each package unit region may comprise: a chip region on which the corresponding semiconductor chip is attached; and an edge region surrounding the chip region, and in which attaching the semiconductor chips may comprise: arranging the semiconductor chips so that the semiconductor chips of a row are arranged offset in the direction of the rows from the semiconductor chips of an adjacent row. In some embodiments, forming the molding layer may comprise sequentially providing a molding compound from a first row of the plurality of rows to a last row of the plurality of rows to form the molding layer to cover the package unit regions of the first row to the package unit regions of the last row, in which the chip regions and the edge regions of the last row are molded at substantially the same time. In some embodiments, the substrate may comprise: saw lines adjacent to the edge region surrounding each chip region, in which the package unit regions of a row may be respectively substantially aligned in a direction substantially perpendicular to the row direction with the saw lines between package unit regions of another row. In some embodiments, the molding layer may extend between the substrate and the semiconductor chips to fill spaces between the substrate and the semiconductor chips.

BRIEF DESCRIPTION OF THE DRAWINGS

The systems, devices and methods disclosed herein will become more apparent in view of the attached drawings and accompanying detailed description.

FIG. 3B is a cross-sectional view taken along lines I-II of FIG. 3A;

FIGS. 5A to 5D are plan views illustrating a method of sawing a substrate according to an embodiment;

FIG. 6A is a cross-sectional view illustrating a sawing apparatus according to an embodiment;

FIGS. 8A to 8C are plan views illustrating a method of sawing a substrate using a sawing apparatus according to an embodiment;

DETAILED DESCRIPTION OF THE EMBODIMENTS

Figure 1A:
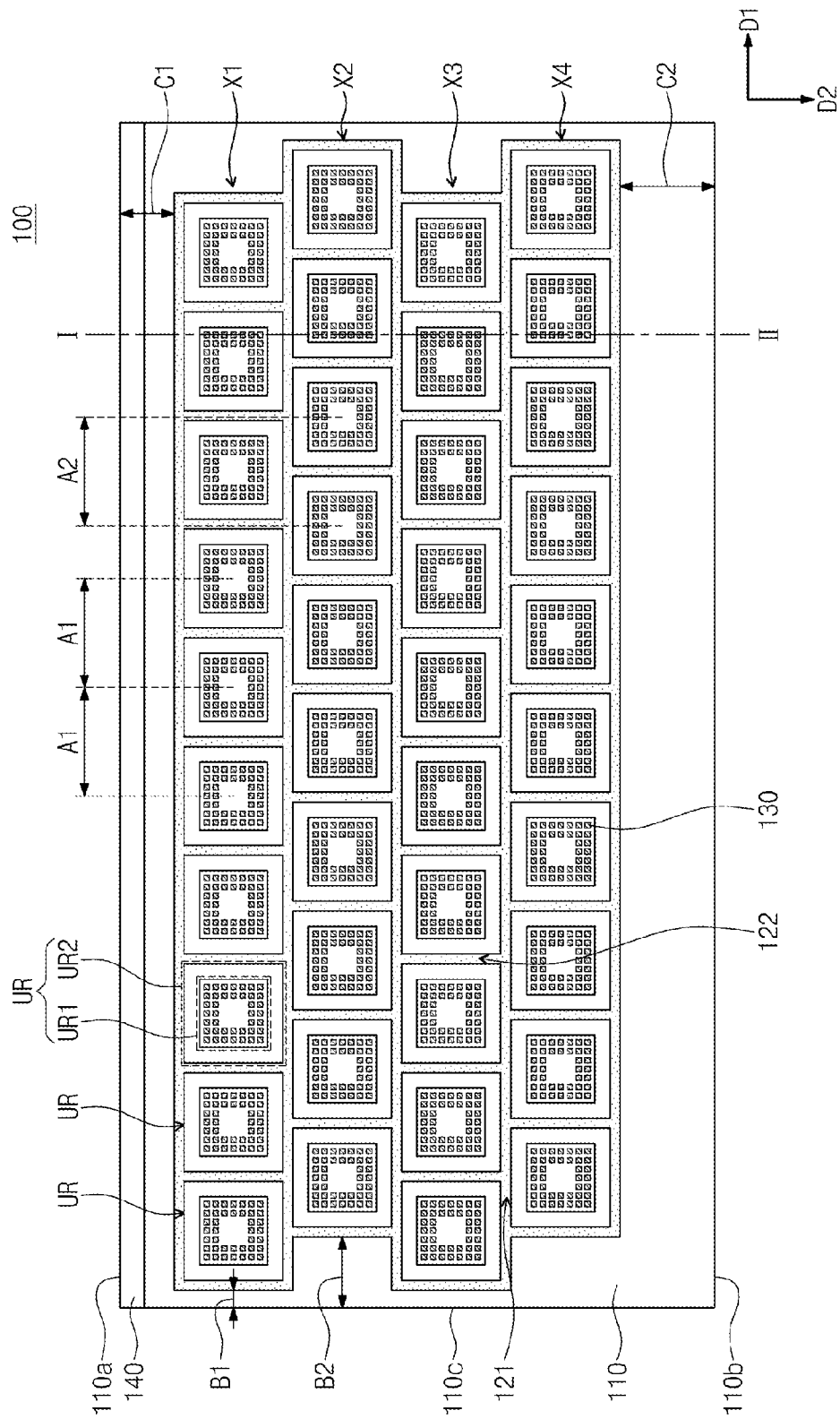
FIG. 1A is a plan view illustrating a substrate according to an embodiment.

The embodiments disclosed herein will now be described more fully hereinafter with reference to the accompanying drawings, in which exemplary embodiments are shown. The advantages and features of the subject matter disclosed herein and methods of achieving them will be apparent from the following exemplary embodiments that will be described in more detail with reference to the accompanying drawings. It should be noted, however, that the disclosed embodiments are not limited to the following exemplary embodiments, and may be implemented in various forms. Accordingly, the exemplary embodiments are provided only to disclose and let those skilled in the art know the features of the various exemplary embodiments. In the drawings, the various embodiments are not limited to the specific examples provided herein and are exaggerated for clarity.

The terminology used herein is for the purpose of describing particular embodiments only and is not intended to limit the claimed subject matter. The word "exemplary" is used herein to mean "serving as an example, instance, or illustration." Any embodiment described herein as "exemplary" is not to be construed as necessarily preferred or advantageous over other embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. In that regard, as used herein, the terms such as, but not limited to, "parallel," "perpendicular," "orthogonal," "equal," "regular," "aligned," "flat" and "coplanar" should respectively be understood as "parallel or substantially parallel," "perpendicular or substantially perpendicular," "orthogonal or substantially orthogonal," "equal or substantially equal," "regular or substantially regular," "aligned or substantially aligned," "flat or substantially flat" and "coplanar or substantially coplanar." Therefore, the embodiments disclosed herein are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the claimed subject matter.

It will be also understood that although the terms first, second, third, etc., may be used herein to describe various elements, these elements should not be limited by these terms. These terms are only used to distinguish one element from another element. Thus, a first element in some embodiments could be termed a second element in other embodiments without departing from the teachings of the disclosed embodiments. Exemplary embodiments that are explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

As should be appreciated, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, substrates according to various embodiments of the inventive concepts will be described with reference to the drawings.

Figure 1B:
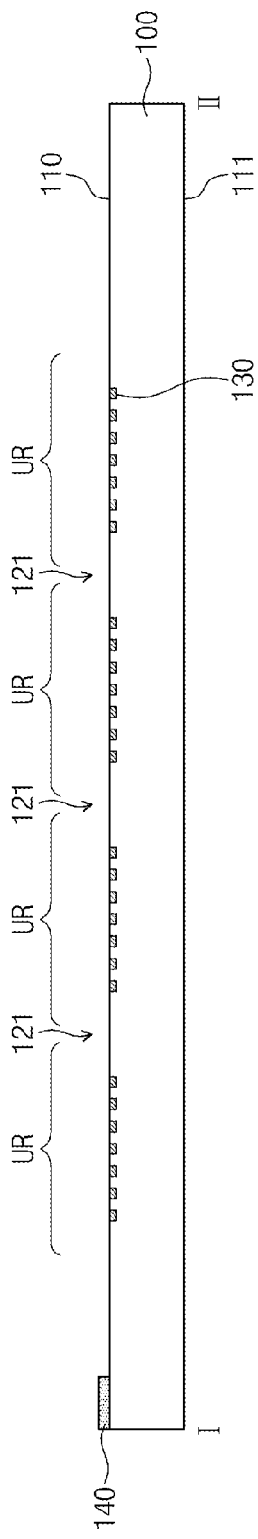
FIGS. 1B and 1C are cross-sectional views taken along a line I-II of FIG. 1.
Figure 1C:
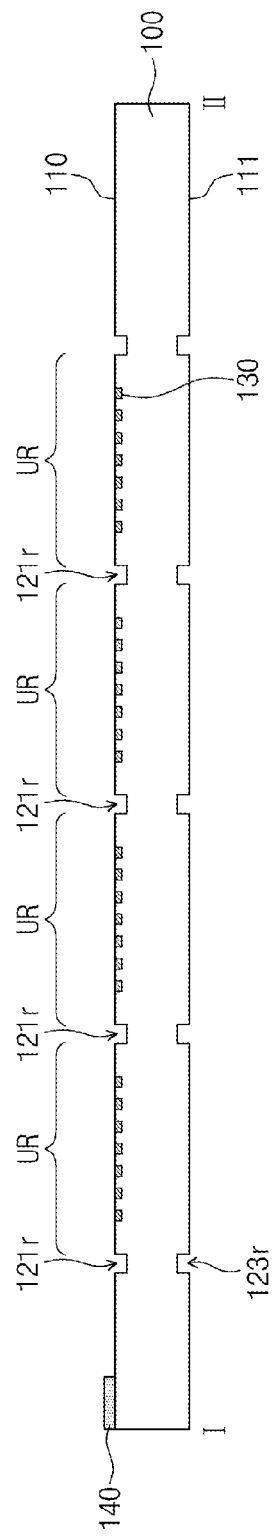

FIG. 1A is a plan view illustrating a substrate according to an embodiment of the inventive concepts, and FIGS. 1B and 1C are cross-sectional views taken along a line I-II of FIG. 1.

Referring to FIG. 1A, a substrate 100 may be a printed circuit board (PCB) having a circuit pattern. Package unit regions UR may be provided on a first surface 110 of the substrate 100. The package unit regions UR may be arranged along a plurality of rows X1 to X4. At least one of the rows X1 to X4 may include a plurality of package unit regions UR. A first row X1 may be defined as a row adjacent to a first side 110a of the first surface 110, and the last row (e.g., a fourth row X4 of FIG. 1) may be defined as a row adjacent to a second side 110b of the first surface 110. The second side 110b is opposite to the first side 110a. The package unit regions UR may be separated from each other by first saw lines 121 and second saw lines 122. The first saw lines 121 may extend in a row direction D1 and may be substantially parallel to each other. The second saw lines 122 may extend in a column direction D2. The second saw lines 122 may be substantially perpendicular to the first saw lines 121 adjacent thereto.

The package unit regions UR may be arranged in a staggered form (or a zigzag form). The package unit regions UR of one row of the rows X1 to X4 may be arranged offset from the package unit regions UR of another row immediately adjacent to the one row in the row direction D1. Here, the row direction D1 may be parallel to the first side 110a of the first surface 110. For example, the package unit regions UR of an n+1-th row may be arranged offset from the package unit region UR of an n-th row in the row direction D1, where "n" denotes a natural number. The package unit regions UR of the n-th row and the package unit regions UR of the n+1-th may be alternately arranged in the column direction D2. The column direction D2 may be substantially parallel to a third side 110c of the first surface 110 and may be substantially perpendicular to the row direction D1. The third side 110c may be connected to one end of the first side 110a and one end of the second side 110b. The package unit regions UR of an n+2-th row may be aligned with the package unit regions UR of the n-th row in the column direction D2, respectively. Thus, the package unit regions UR of the n+2-th row and the package unit regions UR of the n-th row may form columns parallel to the column direction D2. In some embodiments, the package unit regions UR of even-numbered rows X2 and X4 may be arranged offset from the package unit regions UR of odd-numbered rows X1 and X3 in the row direction D1 at regular intervals. The package unit regions UR of the odd-numbered rows X1 and X3 and the package unit regions UR of the even-numbered rows X2 and X4 may be alternately arranged along the column direction D2. The package unit regions UR of the third row X3 and the package unit region UR of the first row X1 may form the columns.

The package unit regions UR may be arranged at regular intervals. For example, distances between central points of the package unit regions UR forming one row may be substantially equal to each other. In addition, the distances between the central points of the package unit regions UR of one row may be substantially equal to distances between central points of the package unit regions UR of another row. For example, distances A1 between central points of the package unit regions UR of the first row X1 may be equal to each other. The distances A1 between the central points of the package unit regions UR of the first row X1 may be equal to distances A2 between central points of the package unit regions UR of the second row X2.

The shortest distance from the third side 110c of the substrate 100 to a first one of the package unit region UR of the n+1-th row may be different from the shortest distance from the third side 110c of the substrate 100 to a first one of the package unit region UR of the n-th row. For example, a distance B1 from the third side 110c of the substrate 100 to a first one of the package unit region UR of the first row X1 may be less than a distance B2 from the third side 110c of the substrate 100 to a first one of the package unit region UR of the second row X2.

A total number of the package unit regions UR forming one of the rows X1 to X4 may be equal to a total number of the package unit regions UR forming each of the others of the rows X1 to X4. A position of the n+1-th row shifted from the n-th row may be controlled to control the number of the package unit regions UR of each of the rows X1 to X4. For example, the package unit regions UR of the second row X2 may be shifted from the package unit regions UR of the first row X1 in the row direction D1 by a distance that is equal to or less than a half of the distance between the central points of the package unit regions UR of the first row X1. The number of the package unit regions UR of the second row X2 may be equal to the number of the package unit regions UR of the first row X1. Even though the package unit regions UR are arranged in the staggered form (or the zigzag form), the total number of the package unit regions UR of the substrate 100 may be equal to the total number of package unit regions of a substrate having regularly arranged package unit regions. As a result, the density of the package unit regions UR of the substrate 100 may be high.

The first surface 110 of the substrate 100 may have a long axis and a short axis that are substantially perpendicular to each other. The long axis may be substantially parallel to the row direction D1, and the short axis may be substantially parallel to the column direction D2. The total number of the package unit regions UR forming one row may be greater than a total number of the rows X1 to X4.

The package unit regions UR may be shifted toward the first side 110a of the first surface 110. For example, a distance C1 between the first row X1 and the first side 110a of the first surface 110 may be less than a distance C2 between the last row (e.g., the fourth row X4) and the second side 110b of the first surface 110.

Figure 2A:
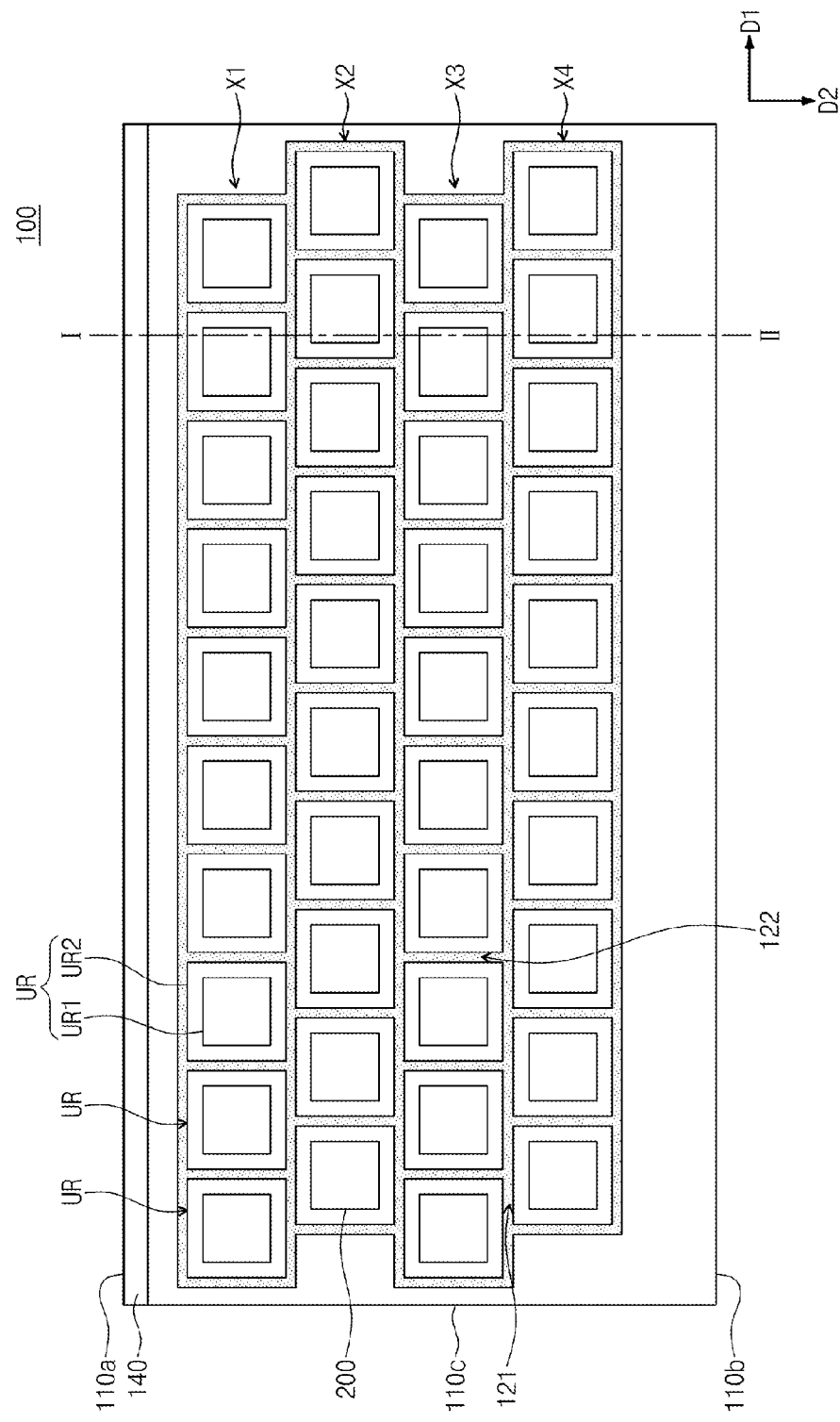
FIG. 2A is a plan view illustrating a method for manufacturing a semiconductor package according to an embodiment.
Figure 2B:
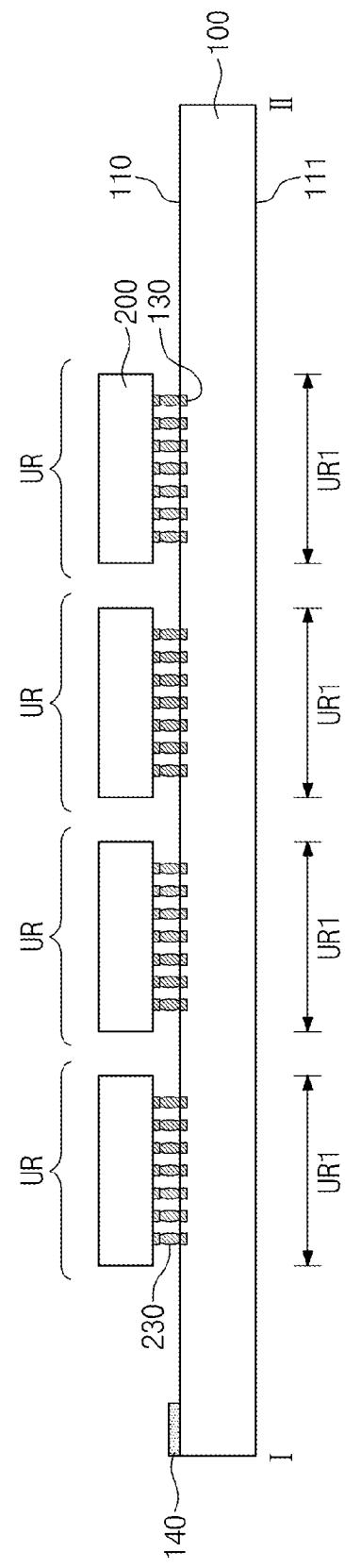
FIG. 2B is a cross-sectional view taken along lines I-II of FIG. 2A.

Each of the package unit regions UR may include a chip region UR1 and an edge region UR2 surrounding the chip region UR1. The chip region UR1 may be defined as a region that is adapted to receive a semiconductor chip 200 and/or in which a semiconductor chip 200 of FIGS. 2A and 2B is disposed. A planar area of the chip region UR1 may be equal to or greater than about 50% of a total planar area of the package unit region UR. At least one of the chip regions UR1 of the second row X2 may be aligned with the second saw line 122 and the edge region UR2 of the first row X1 in the column direction D2. In some embodiments, the chip regions UR1 of the n+1-th row may be aligned with the edge regions UR2 of the n-th row and the second saw lines 122 provided between the package unit regions UR of the n-th row in the column direction D2, respectively. Each of the package unit regions UR may include a plurality of pads 130. The pads 130 may comprise a conductive material (e.g., a metal). The pads 130 may be variously arranged.

A marking portion 140 may be adjacent to the first side 110a of the substrate 100. The marking portion 140 may be used to check whether the package unit regions UR are good or not. For example, the marking portion 140 may show a state (e.g., "good" or "poor") of the package unit regions UR. In other embodiments, the marking portion 140 may be omitted.

Referring to FIGS. 1A and 1B, the substrate 100 may include the first surface 110 and a second surface 111 that are substantially flat. The second surface 111 may be opposite to the first surface 110. The saw lines 121 and 122 may be provided on the first surface 110 of the substrate 100. In some embodiments, the saw lines 121 and 122 may be substantially coplanar with the first surface 110. The first surface 110 of the substrate 100 may be covered with a polymer (e.g., a solder resist). Referring to FIG. 1C, saw lines 121r may be recessed from the first surface 110 of the substrate 100. In a plan view, shapes of the saw lines 121r may be the same as those of the saw lines 121 and 122 of FIG. 1A. The saw lines 121r may be formed by partially etching the first surface 110 of the substrate 100. Assistant saw lines 123r may be formed on the second surface 111 of the substrate 100 at positions opposite to the saw lines 121r. The assistant saw lines 123r may be recessed from the second surface 111 of the substrate 100. In other embodiments, the assistant saw lines 123r may be omitted.

A method for manufacturing a semiconductor package will be described hereinafter.

FIGS. 2A to 4A are plan views illustrating a method for manufacturing a semiconductor package according to an embodiment. In particular, FIG. 2B to 4B is a cross-sectional view taken along lines I-II of FIG. 2A. FIG. 3B is a cross-sectional view taken along lines I-II of FIG. 3A. FIG. 3C is an enlarged view of a region "III" of FIG. 3A. FIG. 4B is a cross-sectional view taken along lines I-II of FIG. 4A. Hereinafter, the descriptions to the same elements as in FIGS. 1A to 1C will be omitted or mentioned briefly for the purpose of ease and convenience in explanation.

Referring to FIGS. 2A and 2B, semiconductor chips 200 may be mounted on a substrate 100. The substrate 100 may be the same as described with reference to FIG. 1A. The semiconductor chips 200 may be provided on the respective chip regions UR1 of the substrate 100. Arrangement of the semiconductor chips 200 may correspond to the arrangement of the package unit regions UR described with reference to FIG. 1A. For example, the mounted semiconductor chips 200 may be arranged in the staggered form (or the zigzag form). The semiconductor chips 200 of one row of the rows X1 to X4 may be arranged offset from the semiconductor chips 200 of another row immediately adjacent to the one row in the row direction D1. The semiconductor chips 200 of even-numbered rows X2 and X4 may be shifted from the semiconductor chips 200 of the odd-numbered rows X1 and X3 in the row direction D1. The semiconductor chip 200 may be electrically connected to the pads 130 through connecting elements 230 on the chip regions UR1. The connecting elements 230 may have a solder ball shape or a bump shape and may comprise a conductive material. The semiconductor chips 200 may be mounted by various methods, unlike the method described above. For example, the semiconductor chips 200 may be electrically connected to the pads 130 through bonding wires (not shown).

Figure 3A:
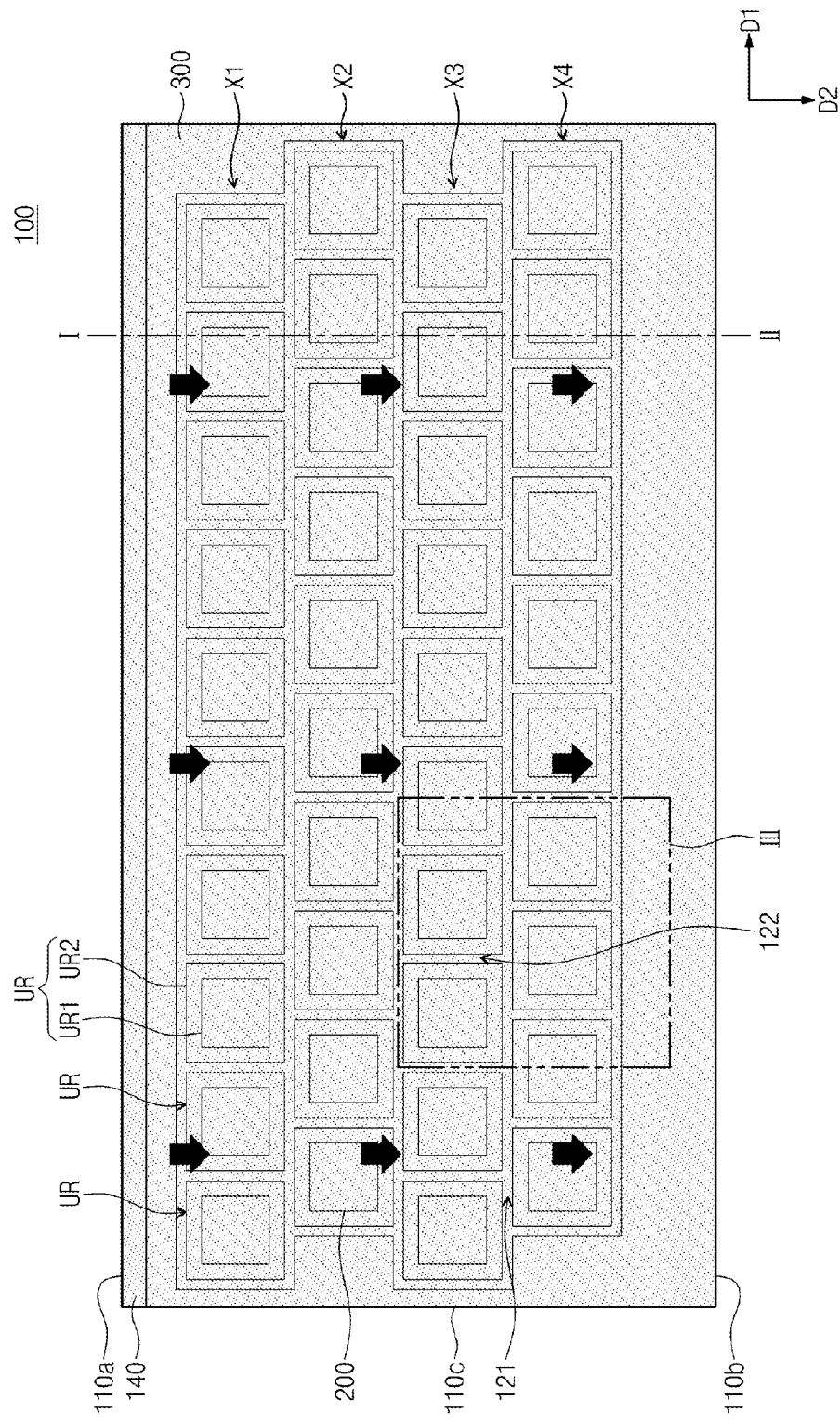
FIG. 3A is a plan view illustrating a method for manufacturing a semiconductor package according to an embodiment.

Referring to FIGS. 3A and 3B, a molding layer 300 may be formed on the first surface 110 of the substrate 100 to cover the semiconductor chips 200. For example, as illustrated in FIG. 3B, the substrate 100 may be placed in a mold 500. The first side 110a of the substrate 100 may face a gate part 510 of the mold 500, and the second side 110b of the substrate 100 may face a vent part 520 of the mold 500. A molding compound may be supplied through the gate part 510 of the mold 500. The molding compound may be an epoxy-based molding compound (EMC). The molding compound may flow from the package unit regions UR of the first row X1 to the package unit regions UR of the last row X4 as depicted by the black arrows in FIGS. 3A and 3B. The molding compound may cover the semiconductor chips 200 to form the molding layer 300. The formation of the molding layer 300 may be performed from the package unit regions UR of the n-th row to the package unit regions UR of the n+1-th row in order. The molding compound may fill spaces between the connecting elements 230, so the molding layer 300 may extend between the substrate 100 and semiconductor chips 200. Thus, a process of forming an additional underfill layer may be omitted. Filling the spaces between the connecting elements 230 and between the substrate 100 and the semiconductor chips 200 with the molding compound may be more difficult than covering the edge regions UR2 with the molding compound. For example, the connecting elements 230 and the semiconductor chips 200 may obstruct the flow of the molding compound. In addition, a property of the molding compound may be more similar to a property of a material coated on the first surface of the substrate 100 than those of materials included in the semiconductor chips 200 and the connecting elements 230. Thus, a flow speed (or a molding speed) of the molding compound on the edge regions UR2 and the saw lines 121 and 122 may be greater than that of the molding compound on the chip regions UR1. However, a difference between these flow speeds of the molding compound may be slight in one row. Thus, in the rows adjacent to the first side 110a, the molding layer 300 may be formed in the package unit regions UR of the same row at substantially the same time. In other embodiments, the molding layer 300 may cover sidewalls of the semiconductor chips 200, but may expose top surfaces of the semiconductor chips 200.

Figure 3C:
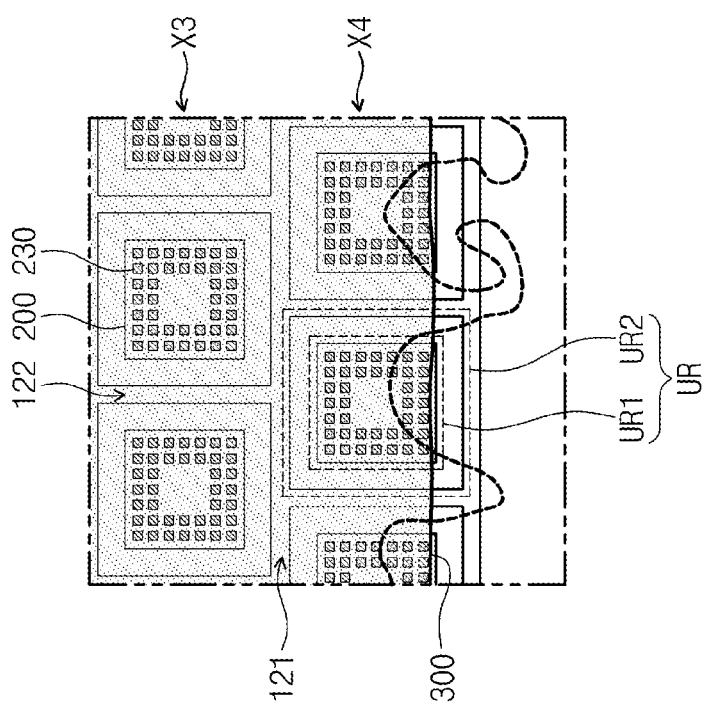
FIG. 3C is an enlarged view of a region "III" of FIG. 3A.

FIG. 3C is an enlarged view of the region "III" of FIG. 3A to illustrate a process of forming the molding layer at a predetermined time. The formation of the molding layer in the package unit regions of the last row will be described in more detail with reference to FIG. 3C.

Referring to FIGS. 3A, 3B, and 3C, the package unit regions UR may be arranged in the staggered form. As illustrated in FIGS. 3A and 3B, the package unit regions UR of the n+1-th row may be respectively arranged offset from the package unit regions UR of the n-th row in the row direction D1. The chip regions UR1 of the second row X2 may be aligned with the edge regions UR2 or the second saw lines 122 of the first row X1 in the column direction D2. Thus, the molding speed difference of the first row X1 and the molding speed difference of the second row X2 may cancel each other, so the molding speed differences of the first and second rows X1 and X2 may not be transferred to the third row X3. In more detail, the fast molding speed of the molding compound on the edge region UR2 and/or the second saw lines 122 of the first row X1 may be canceled by the slow molding speed of the molding compound on the chip region UR1, aligned therewith in the column direction D2, of the second row X2. The fast molding speed of the molding compound on the edge region UR2 and/or the second saw lines 122 of the second row X2 may be canceled by the slow molding speed of the molding compound on the chip region UR1, aligned therewith in the column direction D2, of the first row X1. As a result, as illustrated in FIG. 3C, the chip regions UR1, the edge regions UR2 and the second saw lines 122 of the last row X4 may be molded at substantially the same time.

If the package unit regions UR are regularly arranged along rows and columns unlike the embodiments disclosed herein, the difference between the molding speed of the chip region UR1 and the molding speed of the edge region UR2 of one row may be transferred to the next row. Thus, the molding speed difference of the chip region UR1 and the edge region UR2 may increase as a distance from the last row X4 is reduced. In this case, the molding compound may non-uniformly flow in the package unit regions UR of the last row X4, like the dotted line illustrated in FIG. 3C. For example, at the same time, a distance between the second side 110b and the molding compound disposed on the edge region UR2 and the second saw line 122 may be less than a distance between the second side 110b and the molding compound disposed on the chip region UR1. The molding of the edge regions UR2 and the second saw lines 122 of the last row X4 may be completed before the molding of the chip regions UR1 of the last row X4. Thus, the molding compound supplied to the edge regions UR2 of the last row X4 may flow in a lateral direction or a direction opposite to the column direction D2 so as to be provided to the chip regions UR1. In this case, at least one void (not shown) may be formed in the molding layer 300 disposed on the chip regions UR1. The void may have a diameter of about 100 μm or more. If the diameter of the void is about 100 μm or more, reliability of the semiconductor package may be markedly deteriorated. Heat may be applied to the substrate 100 in the process of forming the molding layer 300. The viscosity of the molding compound may increase as time goes on, so the flow speed of the molding compound may be reduced as it becomes closer to the second side 110b. As the flow speed of the molding compound is reduced, the molding speed difference between the chip region UR1 and the edge region UR2 may increase. In this case, the molding compound may flow more non-uniformly in the last row X4.

Referring again to FIG. 3A to 3C, the rows X1 to X4 may extend in the row direction D1, and the number of the package unit regions UR forming one row may be greater than the number of the rows X1 to X4. In addition, the package unit regions UR may be shifted toward the first side 110a. Thus, a flow time of the molding compound from the first side 110a of the substrate 100 to the last row X4 may be reduced. As a result, the problem of an increase in viscosity of the molding compound over time may be solved, and the molding compound may uniformly flow into the last row X4.

As pitches of the pads 130 and the connecting elements 230 of the chip regions UR1 are reduced, the pads 130 and the connecting elements 230 may increasingly obstruct the flow the molding compound. However, even though the semiconductor chips 200 have fine pitches, the reliability of the semiconductor package may be improved by the arrangement of the package unit regions UR according to the various embodiments disclosed herein.

If the semiconductor chips 200 are thick, a heat release characteristic of the semiconductor chips 200 may be excellent, but the semiconductor chips 200 may further obstruct the flow of the molding compound in the molding process. However, according to various embodiments, the thick semiconductor chips 200 may be sufficiently used by the staggered arrangement of the package unit regions UR. In other words, the molding layer 300 may cover the thick semiconductor chips 200 without the void. The semiconductor chips 200 may have the excellent heat release characteristic, and operation reliability of the semiconductor package may be improved. In particular, it may be possible to prevent the voids having the diameter of 100 μm or more from being formed in the molding layer 300.

Figure 4A:
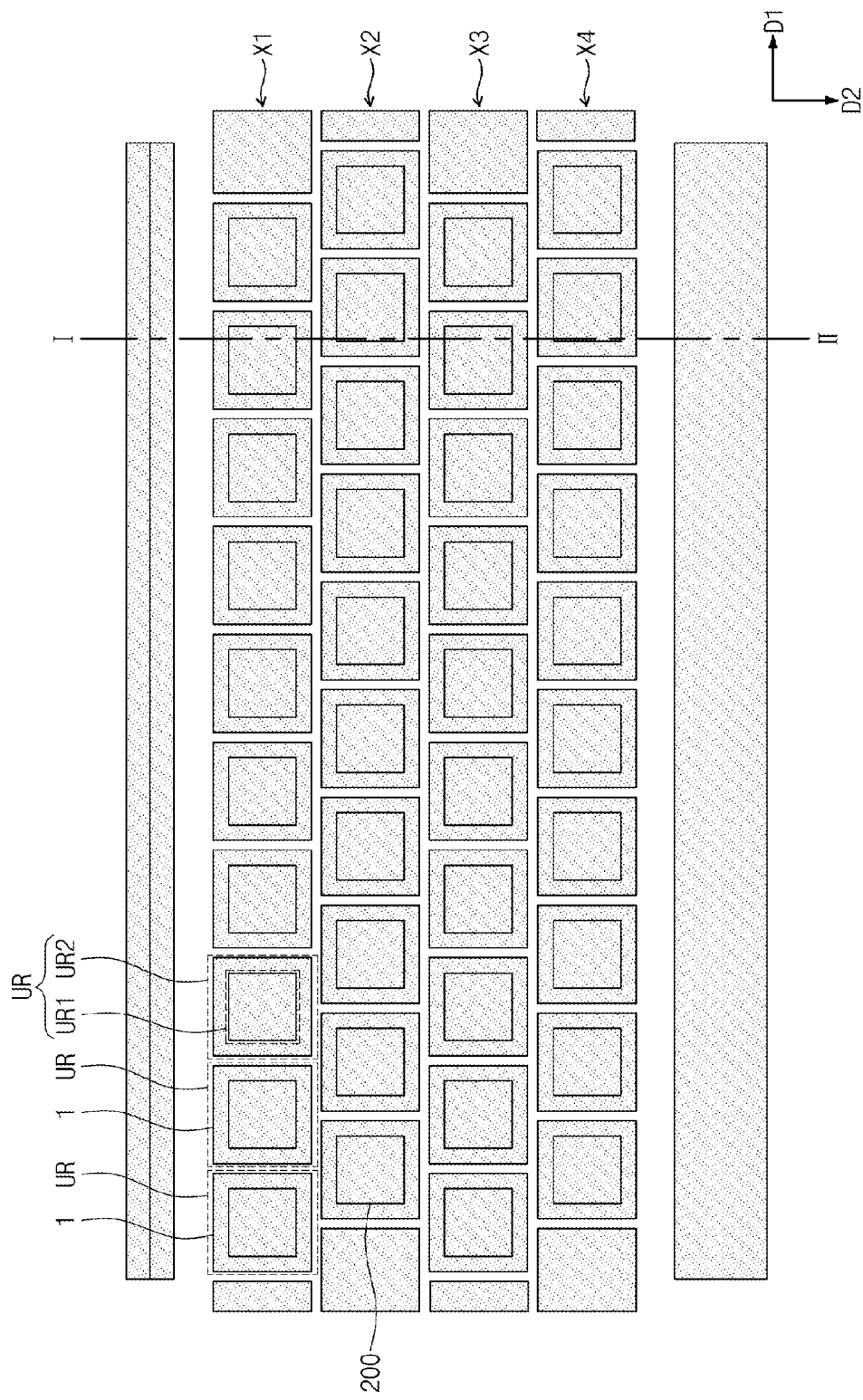
FIG. 4A is a plan view illustrating a method for manufacturing a semiconductor package according to an embodiment.
Figure 4B:
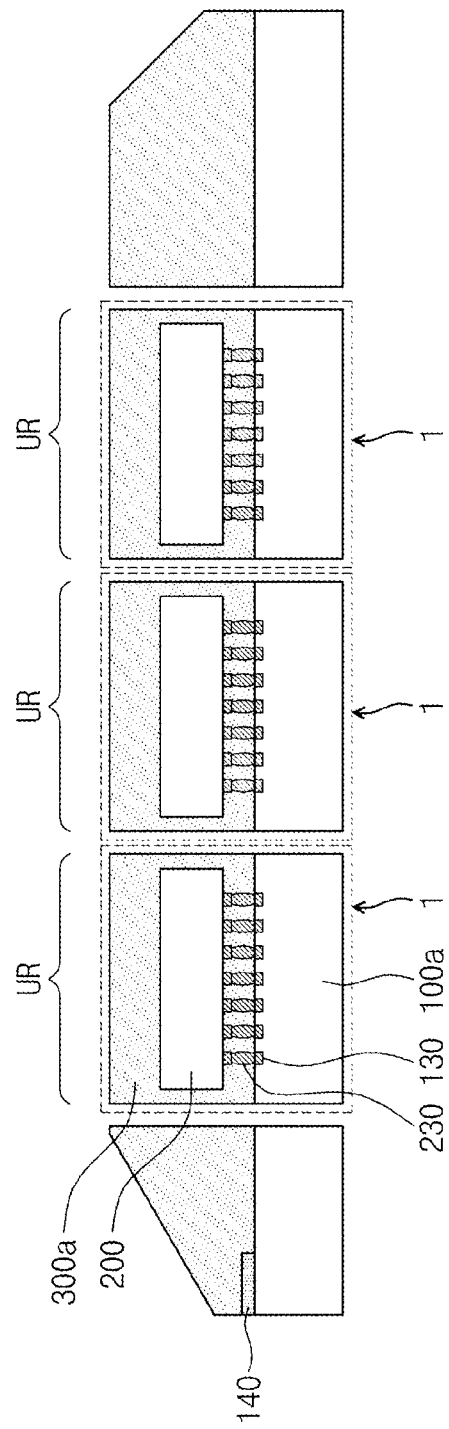
FIG. 4B is a cross-sectional view taken along lines I-II of FIG. 4A.

Referring to FIGS. 4A and 4B, the substrate 100 may be sawed along the saw lines 121 and 122 to separate the package unit regions UR from each other. As a result, semiconductor packages 1 may be manufactured. The package unit regions UR may be respectively included in the semiconductor packages 1. Each of the semiconductor packages 1 may include a package substrate 100a, the semiconductor chip 200, and a unit molding layer 300a. The package substrate 100a may correspond to the package unit region UP of the substrate 100 divided by the sawing process. The unit molding layer 300 may be one of portions, separated from each other by the sawing process, of the molding layer 300. The package unit regions UR arranged in the staggered form may be easily separated from each other by the sawing process using a laser. For example, a laser sawing apparatus may move along the row direction D1 and the column direction D2 to cut the first and second saw lines 121 and 122. In this case, each of the first and second saw lines 121 and 122 may have a width of 40 μm to 60 μm. Since the saw lines 121 and 122 have relatively narrow widths, the number of the package unit regions UR on the first surface 110a may increase. The package unit regions UR are separated from each other by the laser, so each of the package unit regions UR may have one of various planar shapes. Thus, the semiconductor package 1 may be used in various electronic devices. For example, the semiconductor package 1 may have a rounded corner or edge. In this case, stress applied to the edge region UR2 of the semiconductor package 1 may be reduced to minimize or prevent damage of the semiconductor package 1. As illustrated in FIG. 1C, in the case that the saw lines 121r are recessed from the first surface 110, the substrate 100 may be more easily sawed. In the semiconductor package 1, the void may not be formed in the unit molding layer 300a. Thus, the semiconductor package 1 may have excellent mechanical strength and an electrical short between the connecting elements 230 may be prevented during operation of the semiconductor package 1.

FIGS. 5A to 5D are plan views illustrating a method of sawing a substrate according to an embodiment. Hereinafter, the aforementioned descriptions will be omitted or mentioned briefly to avoid redundancy.

Figure 5A:
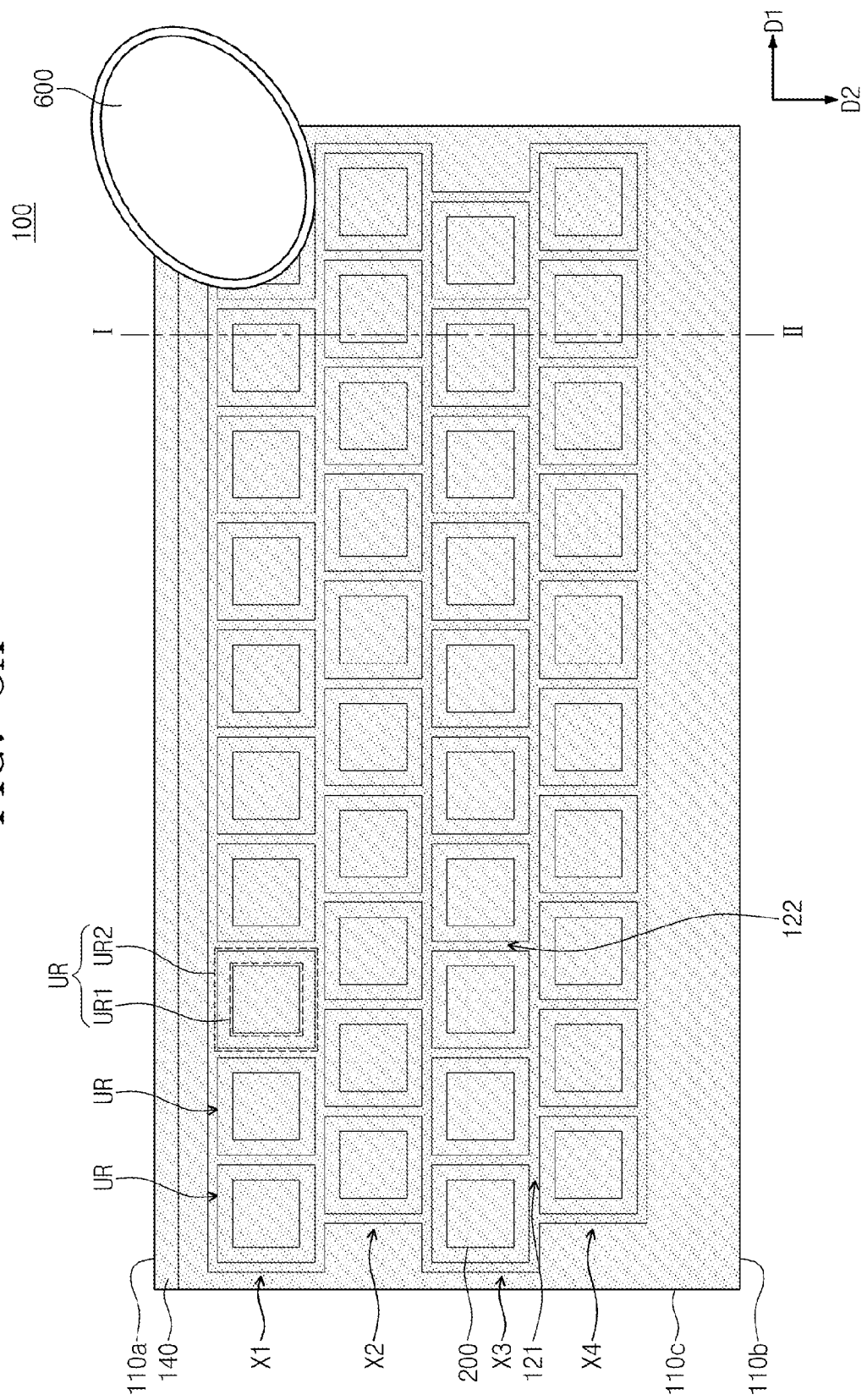
Figure 5B:
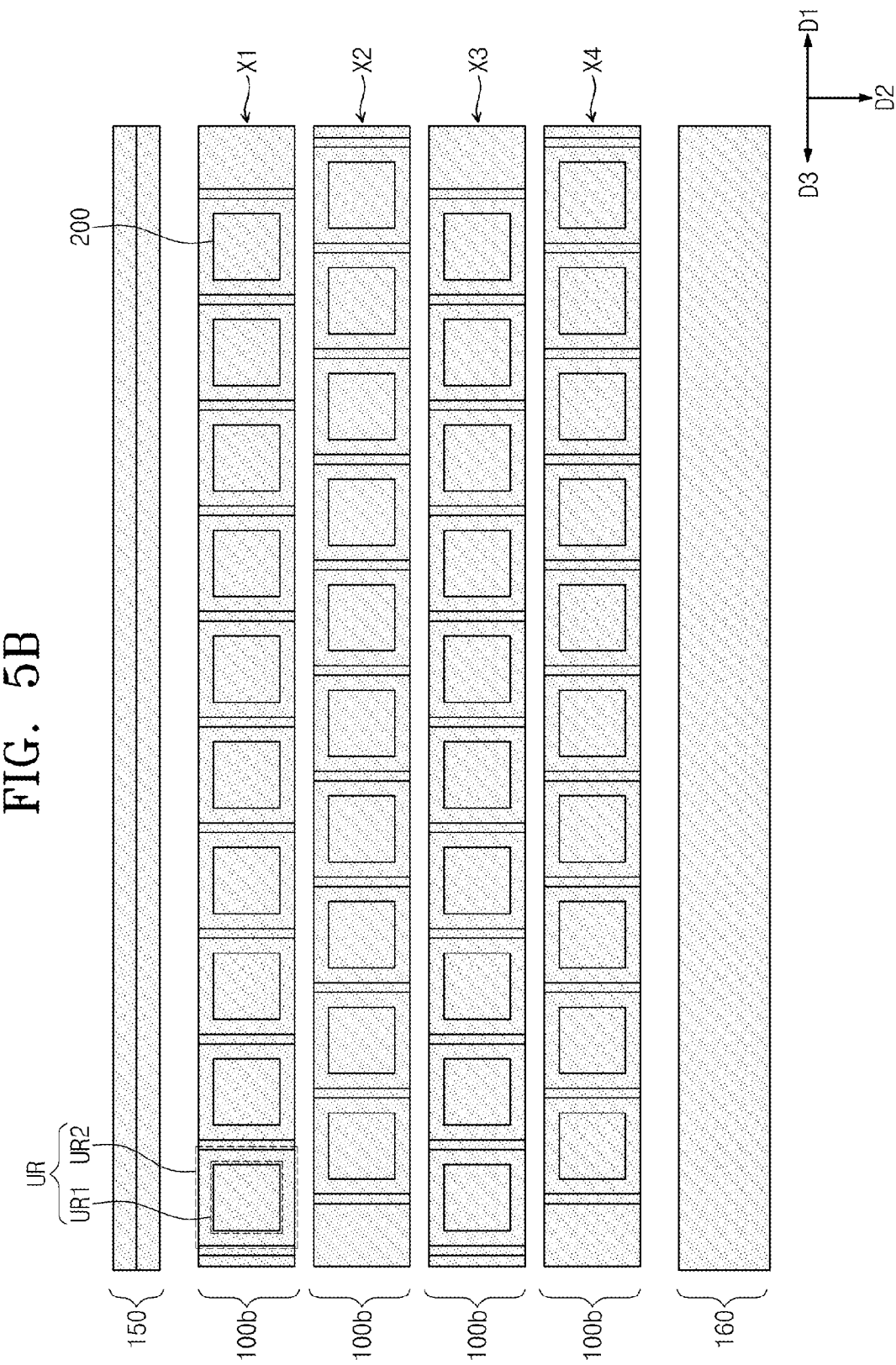

Referring to FIGS. 5A and 5B, the substrate 100 may be sawed along the row direction D1 to form cut portions 110b. At this time, the substrate 100 may have the semiconductor chips 200 and the molding layer 300, as described with reference to FIGS. 2A, 2B, and 3A to 3C. A blade 600 may cut the substrate 100 and the molding layer 300 along the first saw lines 121. In this case, the first saw lines 121 may have a width of about 200 μm. Each of the cut portions 100b may include the package unit regions UR arranged along each of the rows X1 to X4. Thus, the package unit regions UR of each of the rows X1 to X4 may be separated from the package unit regions UR of the others of the rows X1 to X4. A first side portion 150 and a second side portion 160 of the substrate 160 may be removed.

Figure 5C:
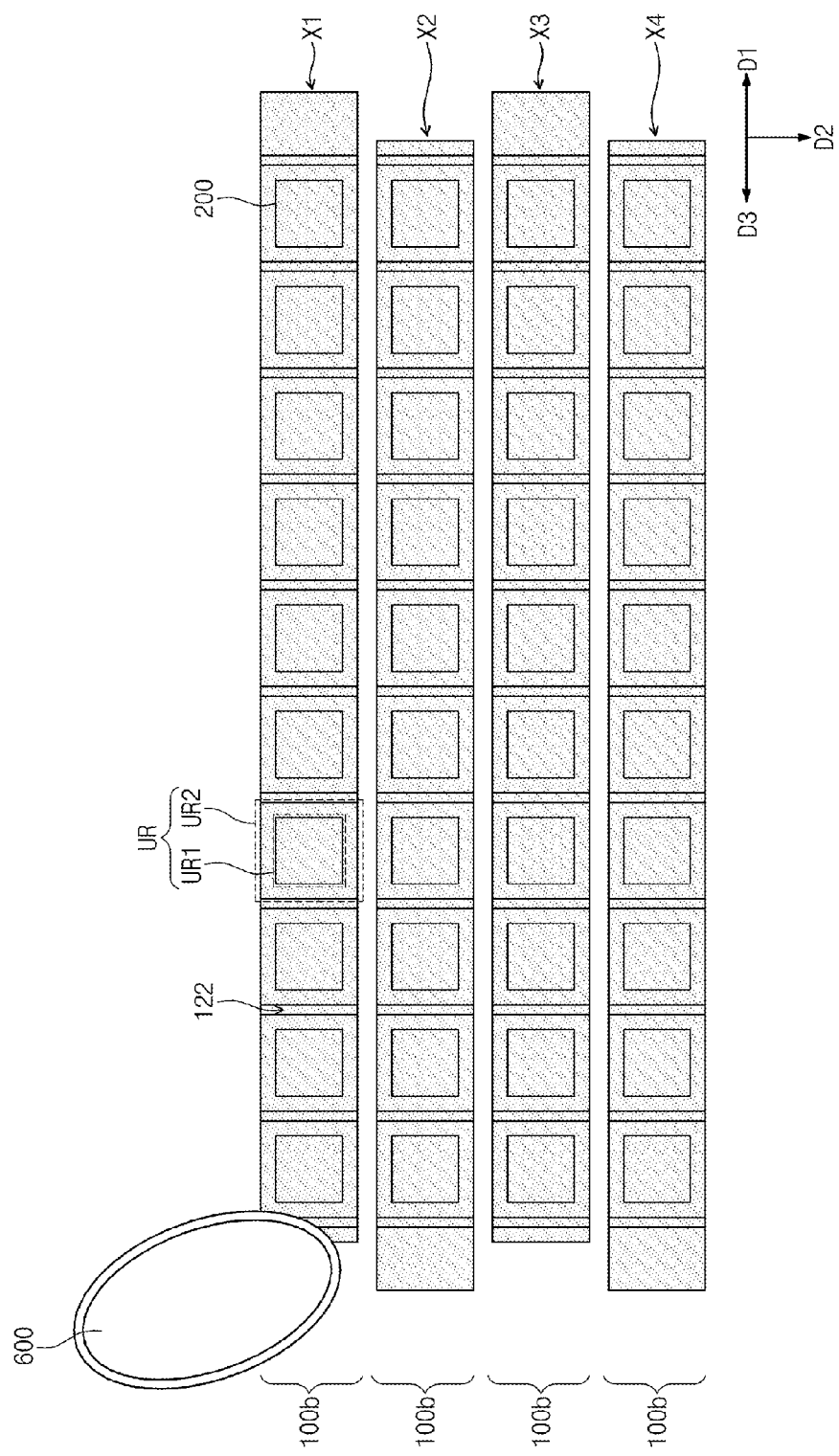

Referring to FIGS. 5C and 5D, at least one of the cut portions 100b may be shifted in the row direction D1, the package unit regions UR of the rows X1 to X4 may be aligned in the column direction D2 to form columns. In some embodiments, the cut portions 110b having the package unit regions UR of the odd-numbered rows X1 and X3 may be shifted in the row direction D1. In other embodiments, the cut portions 110b having the package unit regions UR of the even-numbered rows X2 and X4 may be shifted in a direction D3 opposite to the row direction D1. In still other embodiments, the cut portions 100b of the odd-numbered rows X1 and X3 may be shifted in the row direction D1, and the cut portions 100b of the even-numbered rows X2 and X4 may be shifted in the direction D3 opposite to the row direction D1. The second saw lines 122 of the rows X1 to X4 may be aligned along columns, so the blade 600 may cut the cut portions 100b and the molding layer 300 along the second saw lines 122. The second saw lines 122 may have a width of about 200 µm. Even though the package unit regions UR are arranged in the staggered form, at least one of the cut portions 100b may be shifted in the row direction D1, so the package unit regions UR may be aligned in the column direction D2. This means that the package unit regions UR may be easily separated from each other to form the semiconductor packages 1.

In other embodiments, the first saw lines 121 may be cut by the blade 600, but the second saw lines 122 may be cut using the laser described with reference to FIGS. 4A and 4B. The first saw lines 121 cut by the blade 600 may have a width of about 200 µm. The second saw lines 122 cut by the laser may have a width of 40 µm to 60 µm. In still other embodiments, the first saw lines 120 may be cut using the laser. Thereafter, the cut portions 100b may be shifted, and thus the package unit regions UR of the rows X1 to X4 may form the columns parallel to the column direction D2. Subsequently, the blade 600 may cut the cut portions 100b along the second saw lines 122. In this case, the first saw lines 121 may have a width of 40 µm to 60 µm, and the second saw lines 122 may have a width of about 200 µm.

Hereinafter, a sawing apparatus used in the present embodiment will be described in more detail.

Figure 6B:
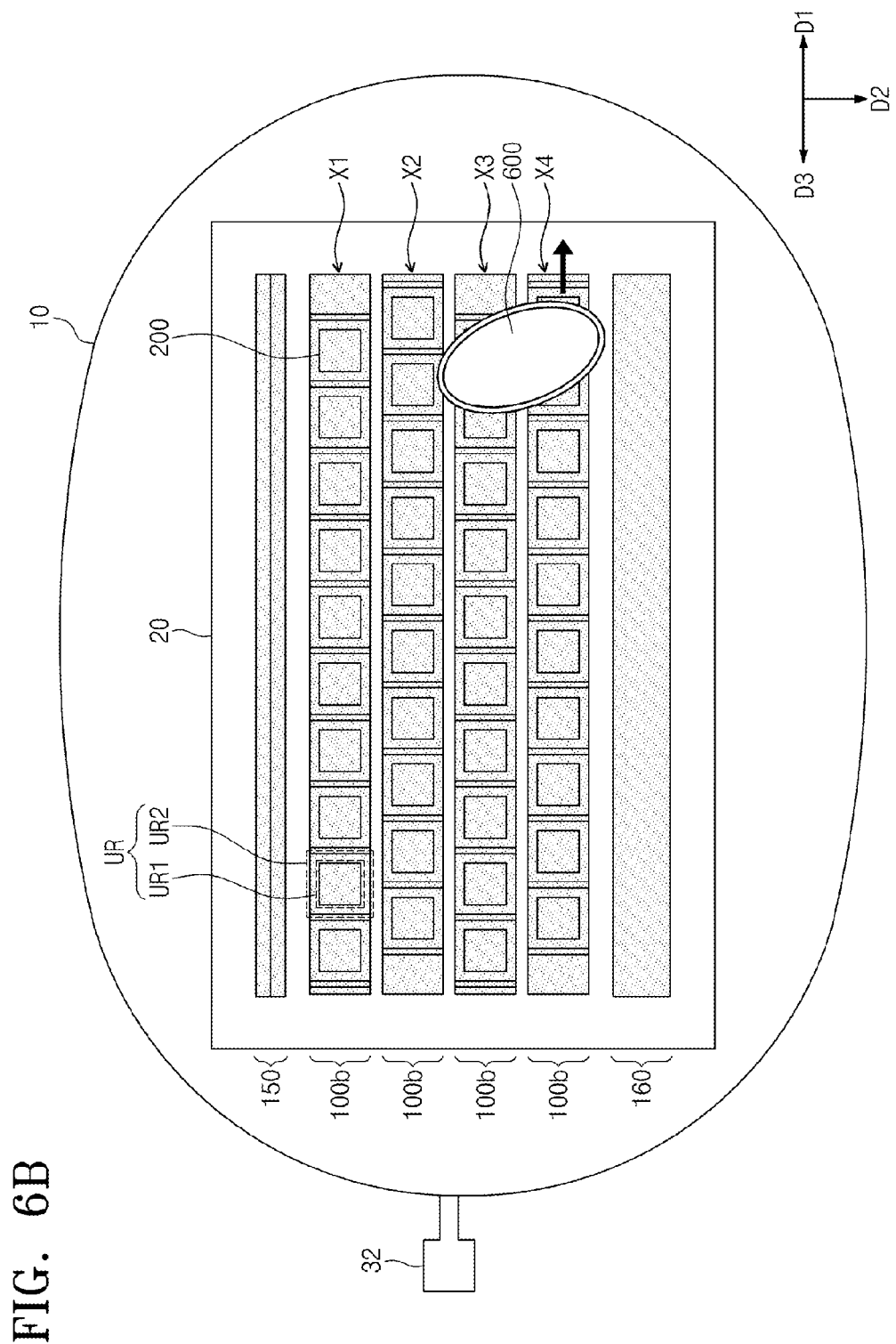
FIGS. 6B to 6D are plan views illustrating a method of sawing a substrate using a sawing apparatus according to an embodiment.
Figure 6C:
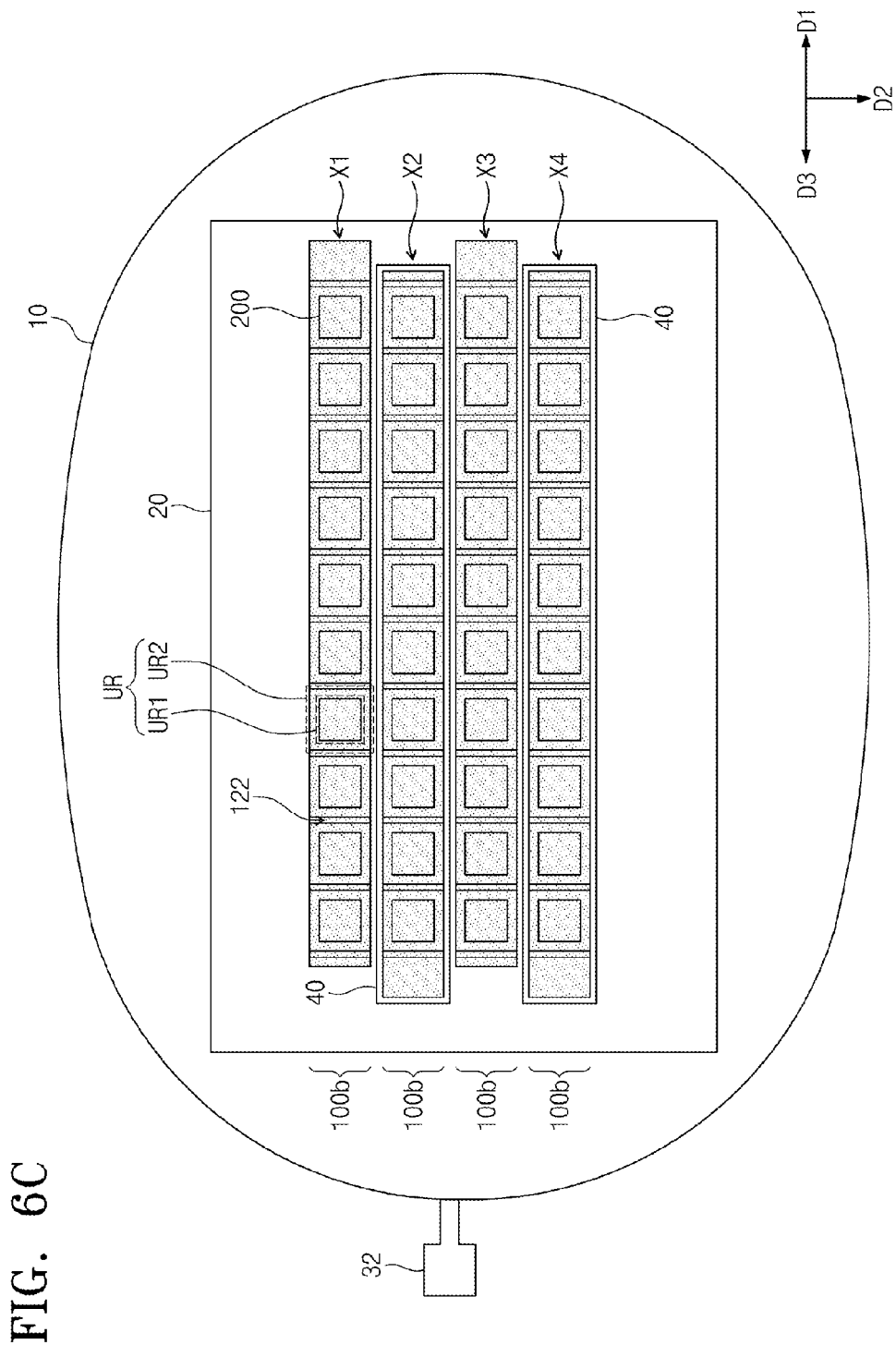
Figure 6D:
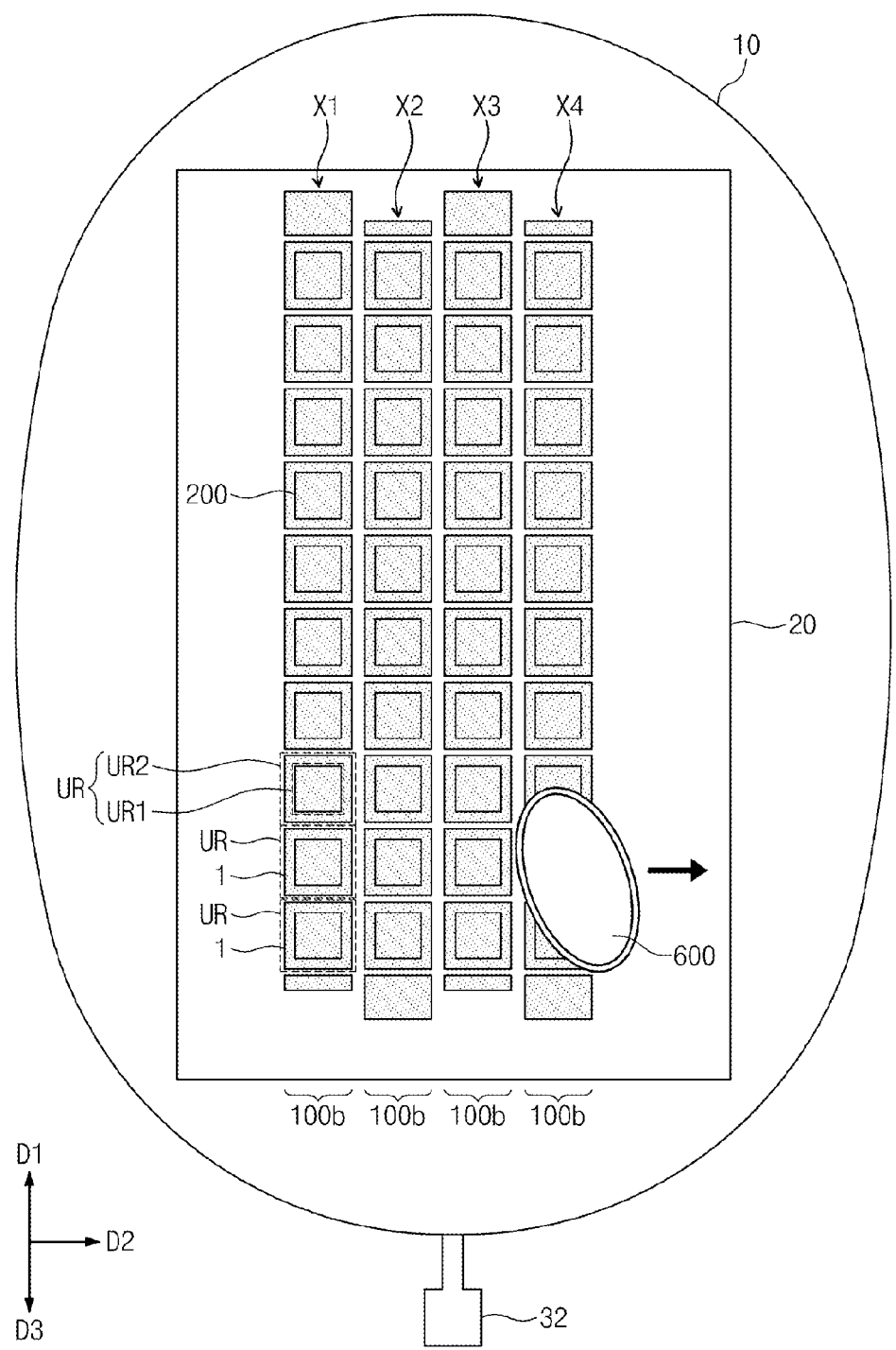

FIG. 6A is a cross-sectional view illustrating a sawing apparatus according to an embodiment. FIGS. 6B to 6D are plan views illustrating a method of sawing a substrate using a sawing apparatus according to an embodiment. Hereinafter, the aforementioned descriptions will be omitted or mentioned briefly to avoid redundancy.

Referring to FIGS. 5A, 6A, and 6B, a sawing apparatus may include a rotation supporter 10, a chuck table 20, actuators 31 and 32, jigs 40, and a blade 600. The chuck table 20 may be disposed on the rotation supporter 10. The rotation supporter 10 may be connected to the actuators 31 and 32, so the rotation supporter 10 and the chuck table 20 may be moved. For example, a first actuator 31 may move the rotation supporter 10 in a direction D4 perpendicular to a top surface 10a of the rotation supporter 10. A second actuator 32 may rotate the rotation supporter 10 on a central axis parallel to the perpendicular direction D4. In this case, the chuck table 20 may be moved in the same direction as the rotation supporter 10. The blade 600 may be the same as the blade 600 of FIG. 5A. The blade 600 may be movable along one direction. The jigs 40 may be disposed over a top surface of the chuck table 20 and may be spaced apart from the top surface of the chuck table 20.

A substrate 100 may be loaded on the chuck table 20. The substrate 100 may be the same as described with reference to FIG. 5A. A position of the substrate 100 may be controlled, so the row direction D1 of the substrate 100 may be substantially parallel to the movable direction of the blade 600. In a plan view, the area of the substrate 100 may be equal to or less than the area of the chuck table 20. As described with reference to FIG. 5A, the substrate 100 may be sawed along the row direction D1 to form the cut portions 100b. For example, the blade 600 may move in the movable direction to cut the substrate 100 and the molding layer 300 along the first saw lines 121. Each of the cut portions 100b may include the package unit regions UR forming each of the rows X1 to X4. First and second side portions 150 and 160 of the substrate 100 may be removed.

Referring to FIGS. 5C and 6C, at least one of the cut portions 100b may be shifted in the row direction D1 by the jigs 40. Thus, the package unit regions UR of the rows X1 to X4 may be aligned to form the columns. The jigs 40 may be movable in the row direction D1, the column direction D2, and/or the perpendicular direction D4 of FIG. 6A. The jigs 40 may descend to vacuum-adsorb the cut portions 100b. The jigs 40 may move at least one of the cut portions 100b in the row direction D1 or the opposite direction D3 of the row direction D1. For example, as described with reference to FIGS. 5C and 5D, the cut portions 100b having the package unit regions UR of the odd-numbered rows X1 and X3 may be shifted in the row direction D1, or the cut portions 100b having the package unit regions UR of the even-numbered rows X2 and X4 may be shifted in the opposite direction D3 of the row direction D1. In other embodiments, the cut portions 100b of the odd-numbered rows X1 and X3 may be shifted in the row direction D1, and the cut portions 100b of the even-numbered rows X2 and X4 may be shifted in the opposite direction D3 of the row direction D1. Thus, the second saw lines 122 of the cut portions 100b may be aligned in the column direction D2.

Referring to FIGS. 5C, 5D, and 6D, the chuck table 20 may rotate, and the blade 600 may cut the cut portions 100b and the molding layer 300 along the second saw lines 122. For example, the chuck table 20 may rotate 90 degrees or 270 degrees by the first actuator 31. Thus, the second saw lines 122 may become parallel to the movable direction of the blade 600. Subsequently, the blade 600 may move along the second saw lines 122 to cut the cut portions 100b, so the package unit regions UR may be separated from each other to form the semiconductor packages 1. At this time, the blade 600 described with reference to FIG. 6B may be used.

Figure 7A:
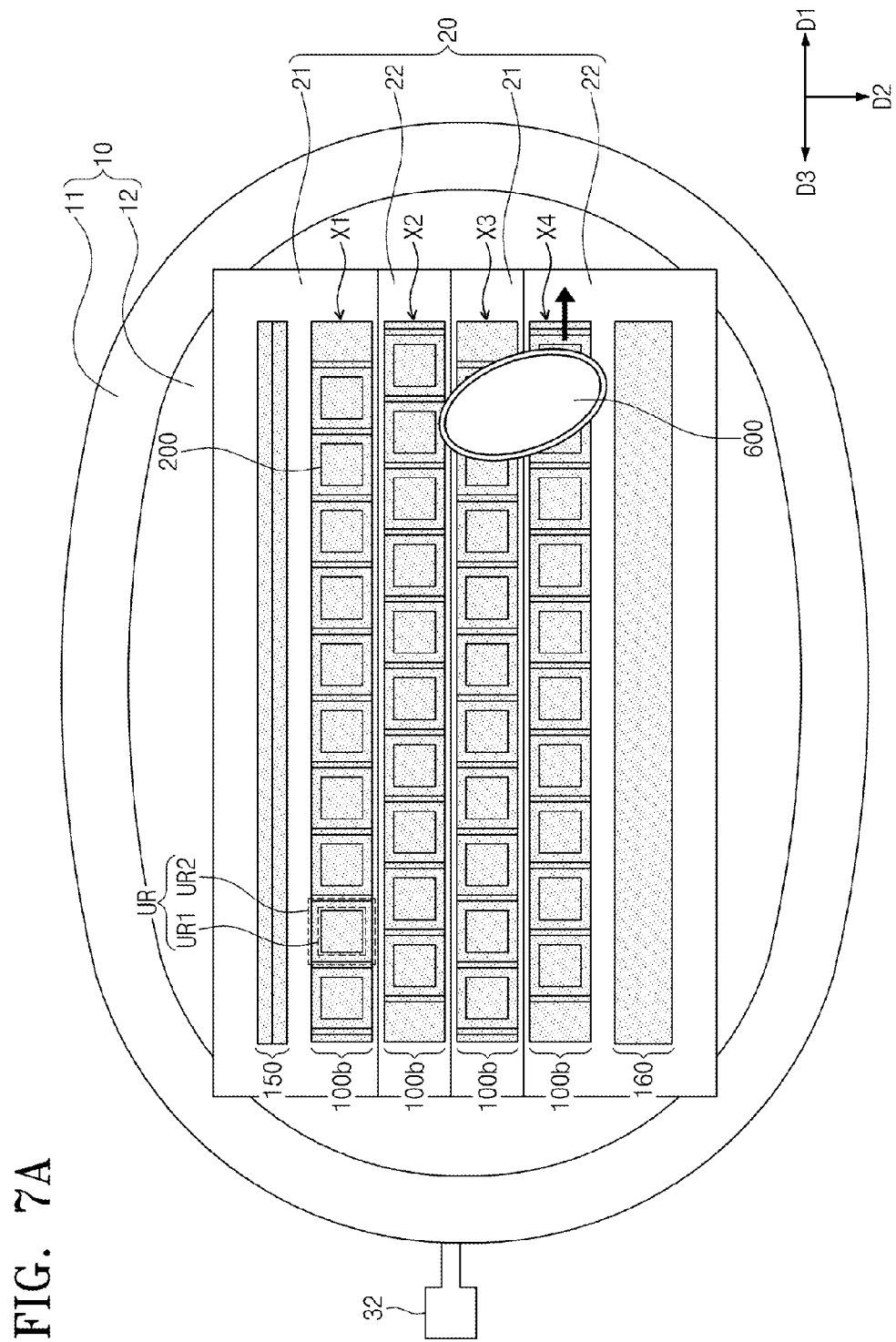
FIGS. 7A to 7C are plan views illustrating a method of sawing a substrate using a sawing apparatus according to an embodiment.
Figure 7B:
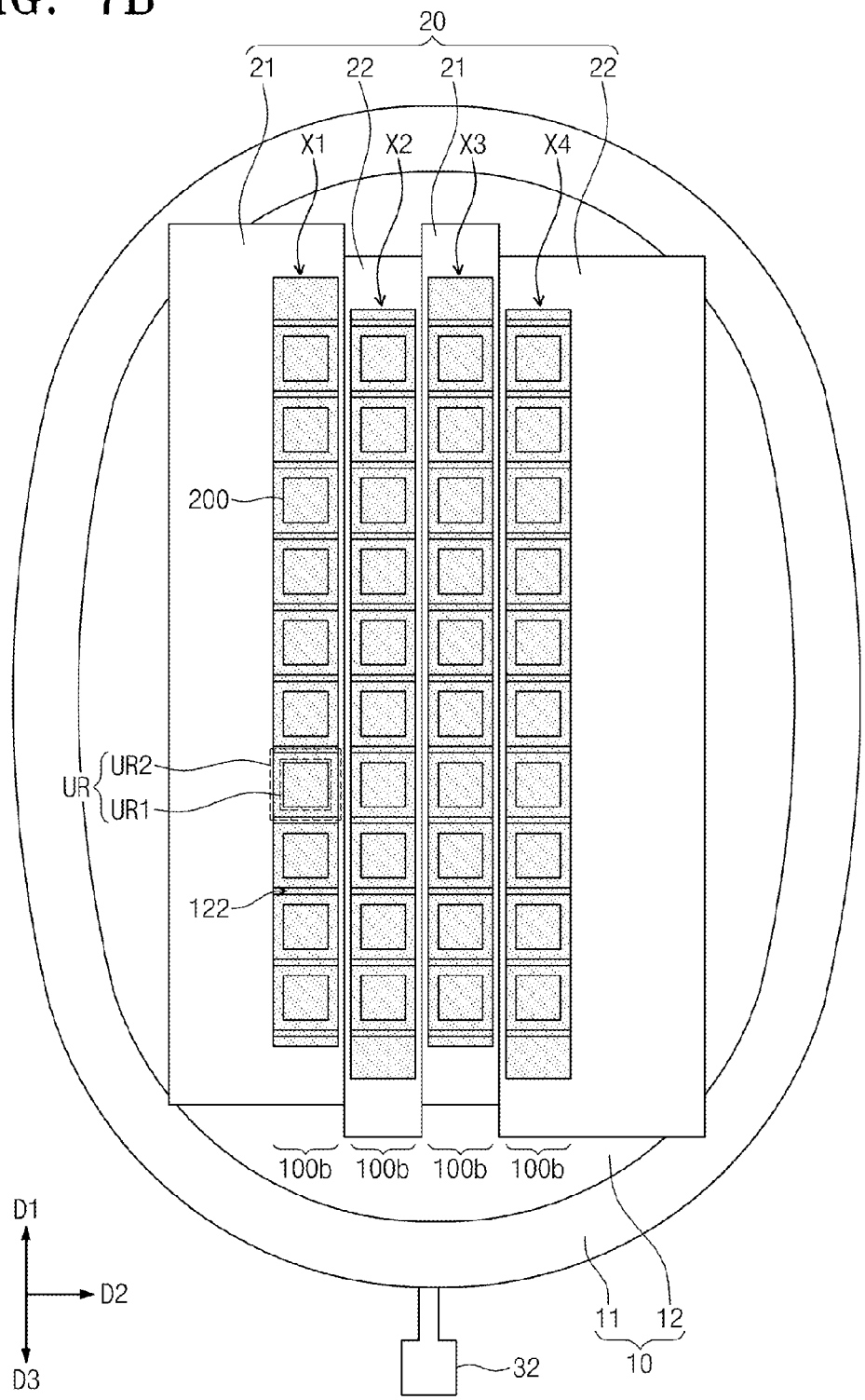
Figure 7C:
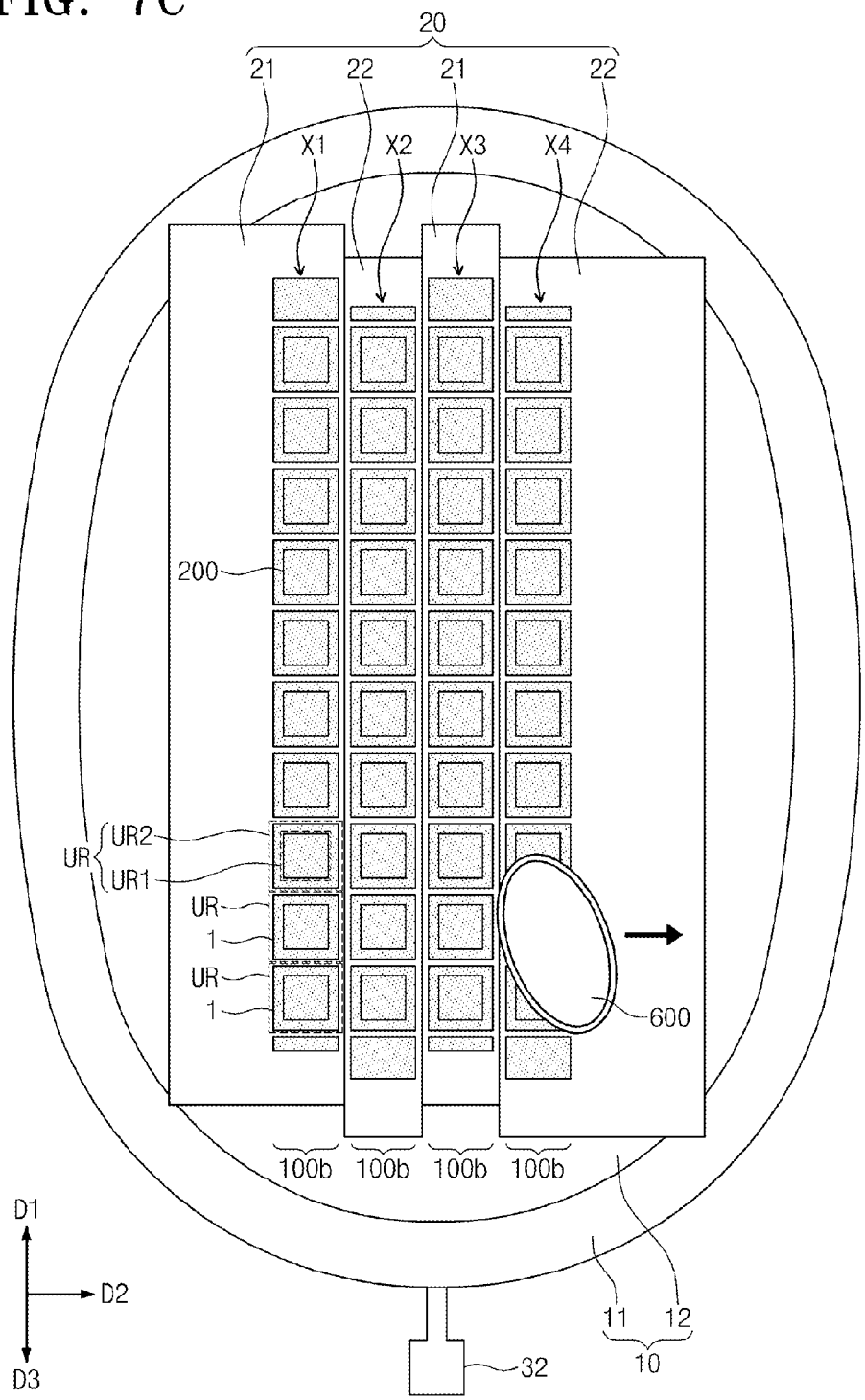

FIGS. 7A to 7C are plan views illustrating a method of sawing a substrate using a sawing apparatus according to an embodiment of the inventive concepts.

Referring to FIGS. 5A, 6A, and 7A, a chuck table 20 may be disposed on a rotation supporter 10. The second actuator 32 of FIG. 6A may be connected to the rotation supporter 10, and the first actuator 31 of FIG. 6A may be omitted. The rotation supporter 10 may include a first rotation supporter 11 and a second rotation supporter 12. The second actuator 32 may rotate the first rotation supporter 11 on a central axis parallel to a direction perpendicular to a top surface of the first rotation supporter 11. The chuck table 20 may be disposed on the rotation supporter 10 and may be rotated in the same direction as the first rotation supporter 11. The chuck table 20 may include a first chuck parts 21 and second chuck parts 22. The chuck parts 21 and 22 may be divided from each other. At least some (e.g., the second chuck parts 22) of the chuck parts 21 and 22 may be fixed on the second rotation supporter 12. In other embodiments, the first chuck parts 21 may be fixed on the first rotation supporter 11. Unlike FIGS. 6A and 6B, the jigs 40 may be omitted.

The substrate 100 may be loaded on the chuck table 20. The rows X1 to X4 of the substrate 100 may overlap with the chuck parts 21 and 22, respectively, when viewed from a plan view. For example, the odd-numbered rows X1 and X3 may overlap with the first chuck parts 21, respectively, and the even-numbered rows X2 and X4 may overlap with the second chuck parts 22, respectively. The substrate 100 may be sawed along the row direction D1 by the blade 600 to form cut portions 100b. For example, the blade 600 may move in one direction to cut the substrate 100 and the molding layer 300 along the first saw lines 121. The method of cutting the substrate 100 and the cut portions 100b formed thereby may be the same as described with reference to FIGS. 5A and 6B. At least one of the cut portions 100b may be fixed on at least one of the chuck parts 21 and 22 by, for example, a vacuum-adsorption method. For example, the cut portions 100b having the package unit regions UR of the even-numbered rows X2 and X4 may be fixed on the second chuck parts 22.

Referring to FIGS. 5C and 7B, the first rotation supporter 11 and the second rotation supporter 12 may move at the same time, so some of the cut portions 100b may be shifted in the row direction D1 and all the cut portions 100b may rotate. For example, the first rotation supporter 11 may be rotated by the second actuator 32, and thus the chuck table 20 and the cut portions 100b on the chuck table 20 may rotate 90 degrees or 270 degrees when viewed from a plan view. Thus, the second saw lines 122 of the cut portions 10b may become parallel to the movable direction of the blade 600.

The second rotation supporter 12 may rectilinearly move the second chuck parts 22 simultaneously with the rotation of the first rotation supporter 11. Some of the cut portions 100b may move in the row direction D1 or the opposite direction D3 of the row direction D1 by the second rotation supporter 12. As described with reference to FIGS. 5C and 5D, the cut portions 100b of the odd-numbered rows X1 and X3 may be shifted in the row direction D1, or the cut portions 100b of the even-numbered rows X2 and X4 may be shifted in the opposite direction D3 of the row direction D1. In other embodiments, the cut portions 100b of the odd-numbered rows X1 and X3 may be shifted in the row direction D1, and the cut portions 100b of the even-numbered rows X2 and X4 may be shifted in the opposite direction D3 of the row direction D1. Thus, the second raw lines 122 of the cut portions 100b may be aligned in the column direction D2.

Referring to FIGS. 5C and 7C, the blade 600 may cut the cut portions 100b and the molding layer 300 along the second saw lines 122. Here, the blade 600 may be the same as described with reference to FIG. 5C. As a result, the package unit regions UR may be separated from each other to manufacture the semiconductor packages 1.

Figure 8B:
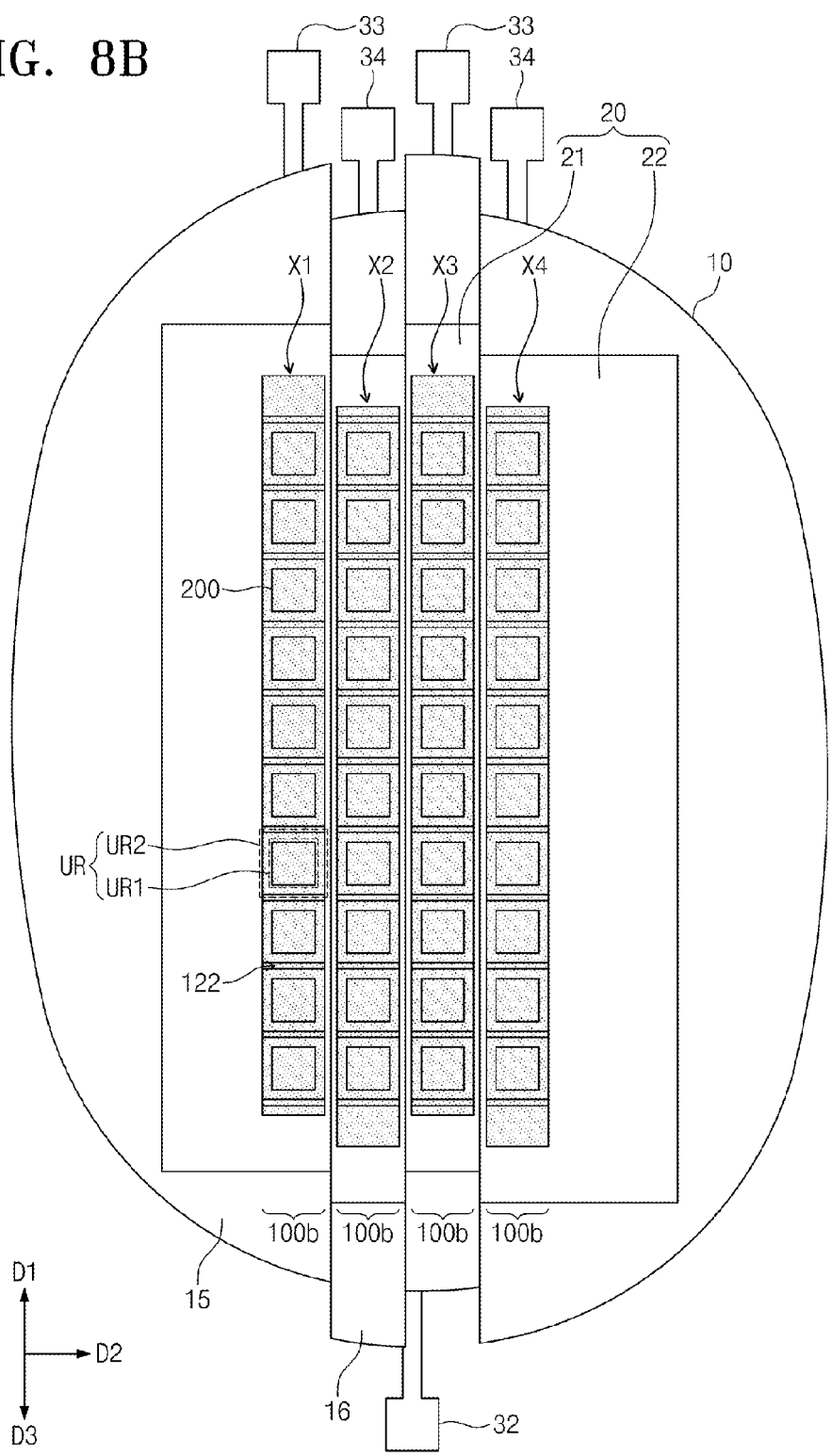

FIGS. 8A to 8C are plan views illustrating a method of sawing a substrate using a sawing apparatus according to an embodiment.

Referring to FIGS. 6A, 7A, and 8A, a chuck table 20 may be disposed on a rotation supporter 10. The rotation supporter 10 may be connected to the first and second actuators 31 and 32 of FIG. 6A and third and fourth actuators 33 and 34. The chuck table 20 may include the first chuck parts 21 and the second chuck parts 22, as described with reference to FIG. 7A. Likewise, the rotation supporter 10 may include first segments 15 and second segments 16 that are divided from each other. The first chuck parts 21 may overlap with the first segments 15, respectively, and the second chuck parts 22 may overlap with the second segments 16, respectively. In some embodiments, the first chuck parts 21 and the second chuck parts 22 may be fixed to the first segments 15 and the second segments 16, respectively. The first and second actuators 31 and 32 may be the same as described with reference to FIG. 6A. The third actuators 33 may be connected to the first segments 15, respectively, and the fourth actuators 34 may be connected to the second segments 16, respectively.

The substrate 100 may be loaded on the chuck table 20. When viewed from a plan view, the rows X1 to X4 of the substrate 100 may overlap with the chuck parts 21 and 22, respectively, like FIG. 7A. The substrate 100 may be sawed along the row direction D1 by the blade 600 to form cut portions 100b. For example, the blade 600 may move in the row direction D1 or the opposite direction D3 of the row direction D1 to cut the substrate 100 and the molding layer 300 along the first saw lines 121. The method of cutting the substrate 100 and the cut portions 100b formed thereby may be the same as described with reference to FIGS. 5A and 7A.

Referring to FIGS. 5C and 8B, the chuck table 20 may rotate and some of the cut portions 100b may be shifted from the row directions D1. The rotation supporter 10 may be rotated by the first actuator 31, so the chuck table 20 and the cut portions 100b on the chuck table 20 may rotate 90 degrees or 270 degrees when viewed from a plan view. Thus, the second saw lines 122 of the cut portions 100b may become parallel to the movable direction of the blade 600.

The first chuck parts 21 may move the cut portions 100b disposed thereon in parallel to the row direction D1 by the third actuators 33. In other embodiments, the second chuck parts 22 may move the cut portions 100b disposed thereon in parallel to the row direction D1 by the fourth actuators 34. The third actuators 33 or the fourth actuators 34 may be omitted. As a result, at least one of the cut portions 100b may be shifted as described with reference to FIGS. 5C and 6C. The rotation and the shift of the cut portions 100b may be performed at the same time. In other embodiments, the cut portions 100b may be shifted before or after the rotation of the cut portions 100b. As a result, the second saw lines 122 of the cut portions 100b may be aligned in the column direction D2.

Referring to FIGS. 5C and 8C, the blade 600 may cut the cut portions 100b and the molding layer 300 along the second saw lines 122. Here, the blade 600 may be the same as described with reference to FIG. 5C. Thus, the package unit regions UR may be separated from each other to manufacture the semiconductor packages 1.

In other embodiments, at least two of the sawing apparatuses of FIGS. 6A to 6C, FIGS. 7A to 7C, and 8A to 8C may be combined with each other. For example, the combined sawing apparatus may include at least two of the jigs 40 of FIGS. 6A to 6C, the chuck table 20 and the rotation supporters 11 and 12 of FIGS. 7A to 7C, or the rotation supporter 10 connected to the third and fourth actuators 33 and 34 of FIGS. 8A to 8C.

Figure 9A:
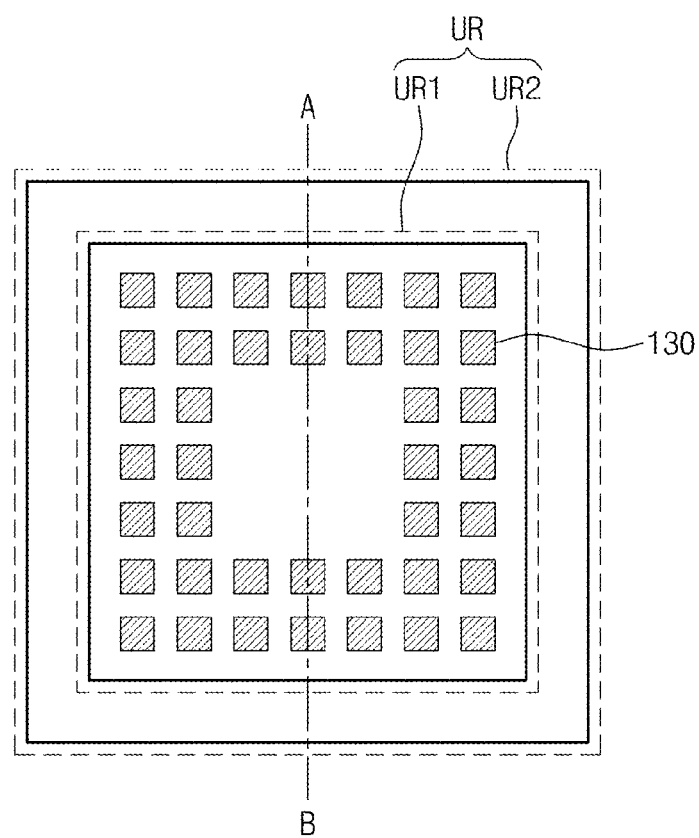
FIG. 9A is an enlarged plan view illustrating one package unit region of a substrate according to an embodiment.
Figure 9B:
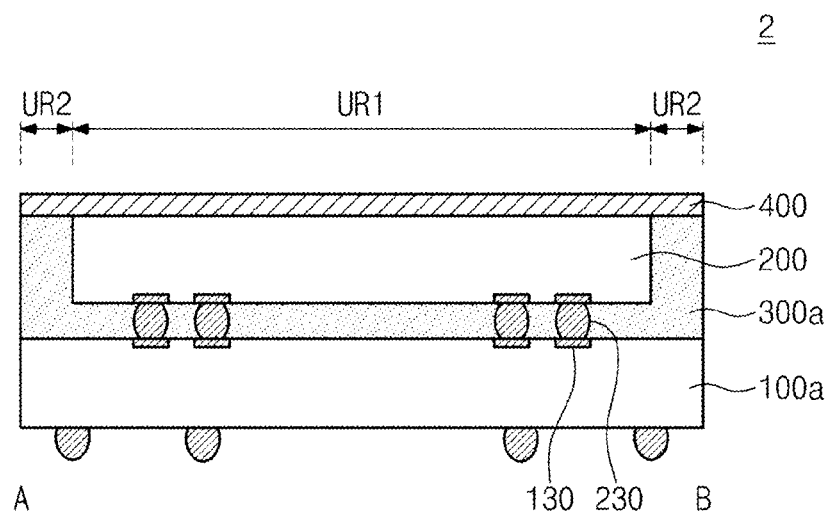
FIG. 9B is a cross-sectional view taken along line A-B in FIG. 9A illustrating a semiconductor package manufactured using a substrate and the package unit region of FIG. 9A.
Figure 10A:
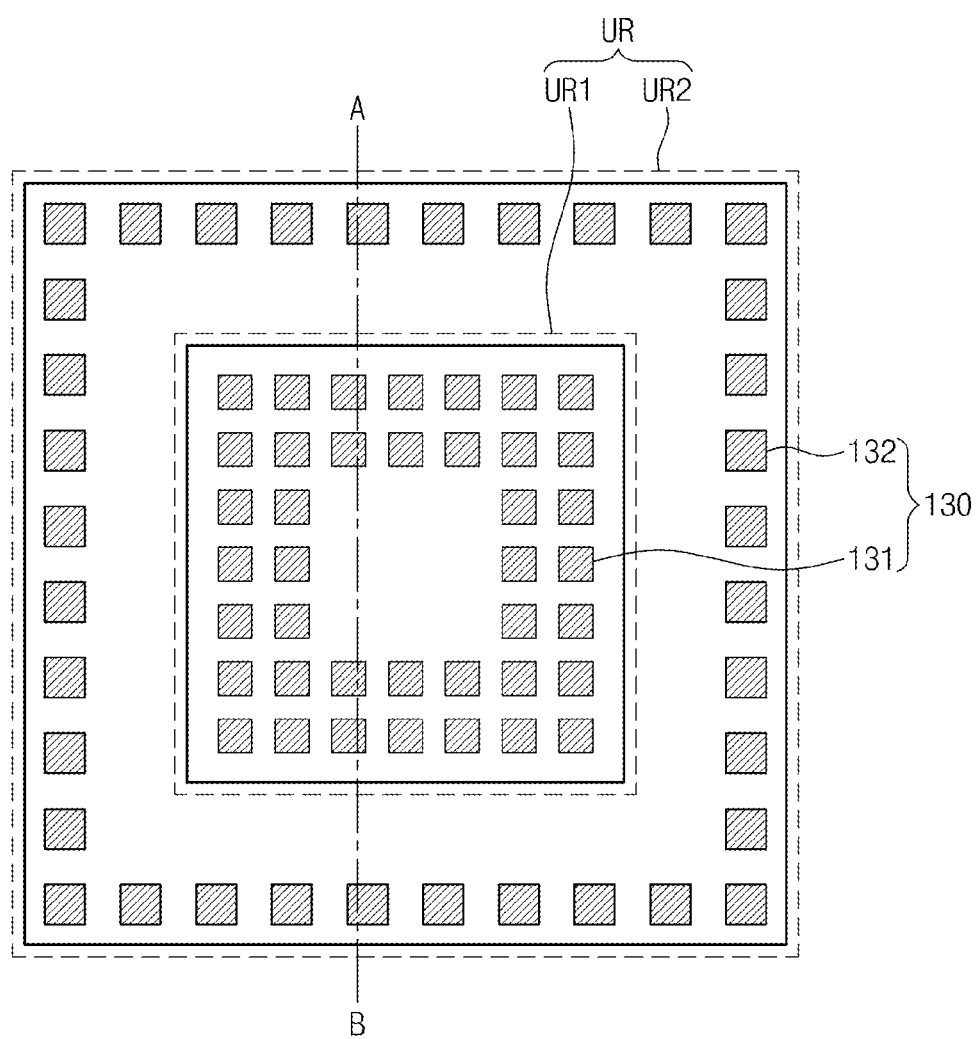
FIG. 10A is an enlarged plan view illustrating one package unit region of a substrate according to an embodiment.
Figure 10B:
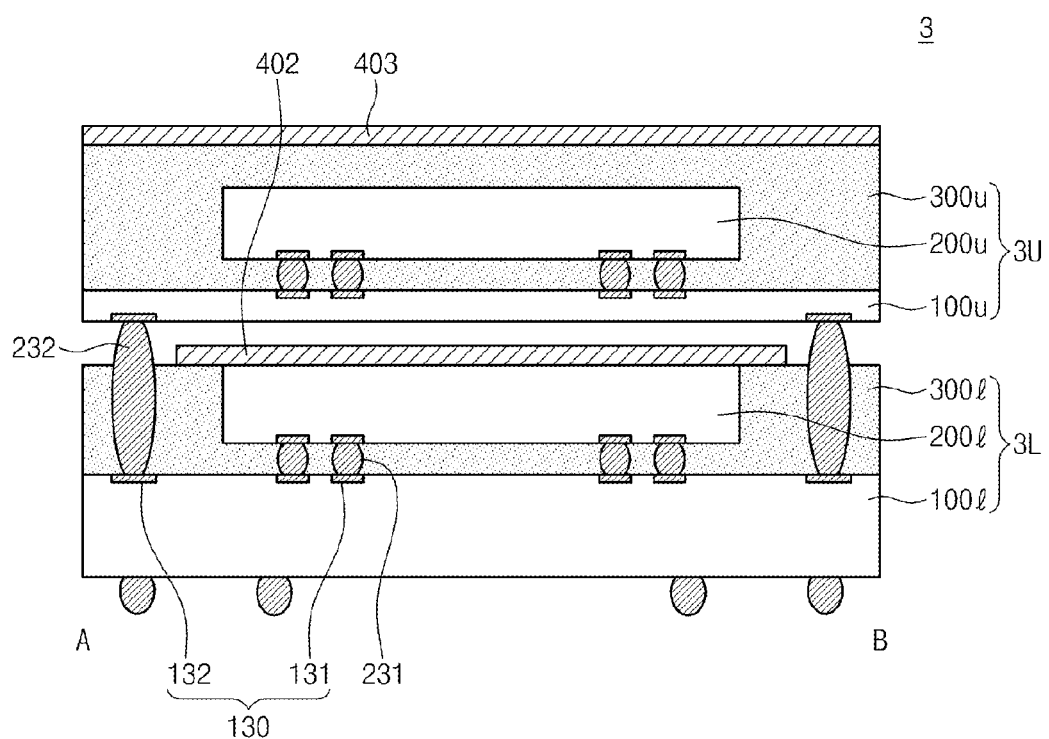
FIG. 10B is a cross-sectional view taken along line A-B in FIG. 10A illustrating a semiconductor package manufactured using a substrate and the package unit region of FIG. 10A.

FIG. 9A is an enlarged plan view illustrating one package unit region of a substrate according to an embodiment, and FIG. 9B is a cross-sectional view taken along line A-B in FIG. 9A illustrating a semiconductor package manufactured using a substrate and the package unit region of FIG. 9A. FIG. 10A is an enlarged plan view illustrating one package unit region of a substrate according to an embodiment, and FIG. 10B is a cross-sectional view taken along line A-B in FIG. 10A illustrating a semiconductor package manufactured using a substrate and the package unit region of FIG. 10A. Hereinafter, a single package unit region will be described as an example with reference to FIGS. 9A, 9B, 10A, and 10B.

Referring to FIGS. 9A and 9B, the chip region UR1 may be a region on which the semiconductor chip is mounted. The edge region UR2 may surround the chip region UR1 when viewed from a plan view. The pads 130 may be provided on the chip region UR1. A semiconductor package 2 of FIG. 9B may be manufactured using the substrate 100 having the package unit region UR of FIG. 9A. The semiconductor package 2 may be manufactured as described with reference to FIGS. 2A through 5D. The semiconductor package 2 may include a package substrate 100a, a semiconductor chip 200, and a unit molding layer 300a. The semiconductor chip 200 may be electrically connected to the pads 130 through connecting elements 230. The semiconductor package 2 may further include a heat release part 400 provided on the semiconductor chip 200. The heat release part 400 may include a heat slug or a heat sink. Alternatively, the heat release part 400 may be omitted.

Referring to FIGS. 10A and 10B, pads 130 may be provided on the chip region UR1 and the edge region UR2. For example, the pads 130 may include first pads 131 provided on the chip regions UR1 and second pads 132 provided on the edge region UR2. A semiconductor package 3 of FIG. 10B may be manufactured using a substrate 100 including the package unit region UR of FIG. 10A. The semiconductor package 3 may include a lower package 3L and an upper package 3U. The lower package 3L may include a lower package substrate 100*l*, a lower semiconductor chip 200*l*, and a lower molding layer 300*l*. The lower package substrate 100*l*, the lower semiconductor chip 200*l*, and the lower molding layer 300*l* may respectively be the same as or similar to the package substrate 100a, the semiconductor chip 200, and the unit molding layer 300a of FIG. 4B. The lower package 3L may be manufactured as described with reference to FIGS. 2A through 4B. The lower semiconductor chip 200*l* may be electrically connected to the first pads 131 through connecting elements 231. Portions of the lower molding layer 300*l* may be removed to expose the second pads 132. Bumps 232 may be formed on the lower package substrate 100*l* so as to be connected to the second pads 132. The upper package 3U may be electrically connected to the lower package 3L through the bumps 232. The upper package 3U may include an upper package substrate 100u, an upper semiconductor chip 200u, and an upper molding layer 300u. The upper package 3U may be manufactured as described with reference to FIGS. 2A to 4B. The upper package substrate 100u, the upper semiconductor chip 200u, and the upper molding layer 300u may respectively be the same as or similar to the package substrate 100a, the semiconductor chip 200, and the unit molding layer 300a of FIG. 4B. A lower heat release part 402 may be provided on the lower semiconductor chip 200*l*, and an upper heat release part 403 may be provided on the upper semiconductor chip 200u. In other embodiments, at least one of the lower and upper heat release parts 402 and 403 may be omitted.

Modified embodiments of the arrangement of the package unit regions of the substrate will be described hereinafter.

Figure 11:
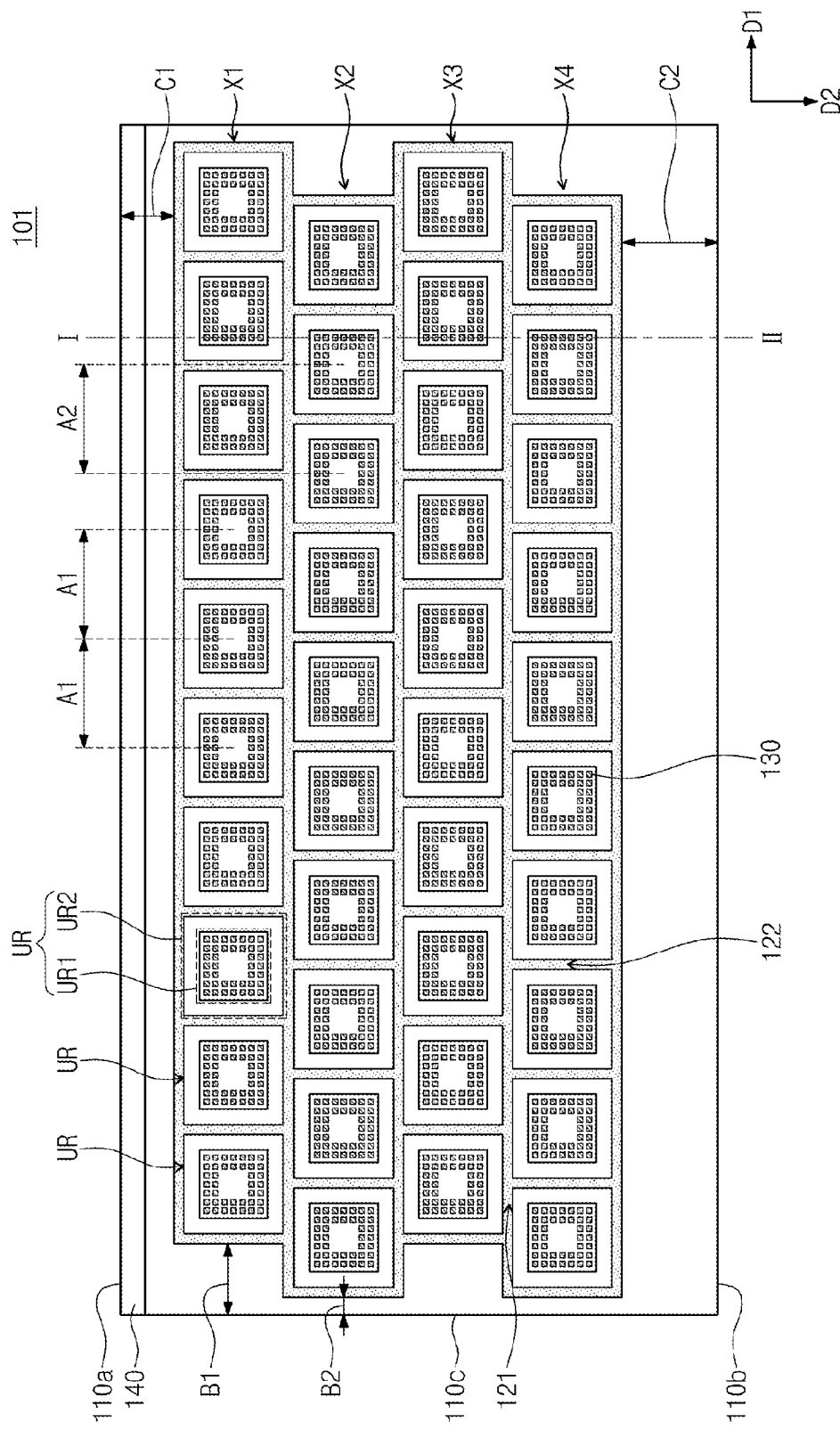
FIG. 11 is a plan view illustrating a substrate according to an embodiment.

FIG. 11 is a plan view illustrating a substrate according to an embodiment. In the present embodiment, the descriptions to the same elements as in the aforementioned embodiments will be omitted or mentioned briefly for the purpose of ease and convenience in explanation.

Referring to FIG. 11, package unit regions UR may be arranged along a plurality of rows X1 to X4 on one surface of a substrate 101. Each of the rows X1 to X4 may include a plurality of package unit regions UR.

The package unit regions UR may be arranged in a staggered form (or a zigzag form). The package unit regions UR of one row of the rows X1 to X4 may be arranged offset from the package unit regions UR of another row of the rows X1 to X4 in a row direction D1. For example, the package unit regions UR of an n+1-th row may be arranged offset from the package unit region UR of an n-th row in the row direction D1, where "n" denotes a natural number. Arrangement and a pitch of the package unit regions UR may be the same as described with reference to FIG. 1A.

Symmetry may be between the arrangement of the package unit regions UR of the present embodiment and the arrangement of the package unit regions UR of FIG. 1. For example, a distance B1 from a third side 110c of the substrate 101 to a first one of the package unit regions UR of the first row X1 may be greater than a distance B2 from the third side 110c of the substrate 101 to a first one of the package unit regions UR of the second row X2.

A long axis of the substrate 101 may extend in the row direction D1. The number of the package unit regions UR forming one of the rows X1 to X4 may be equal to the number of the package unit regions UR forming each of the others of the rows X1 to X4. The number of the package unit regions UR forming one row may be greater than a total number of the rows X1 to X4. The package unit regions UR may be shifted toward the first side 110a of the one surface of the substrate 101. Each of the package unit regions UR may include a chip region UR1 and an edge region UR2. The arrangement of the chip regions UR1 may correspond to the arrangement of the package unit regions UR. Each of the package unit regions UR may include a plurality of pads 130.

Figure 12:
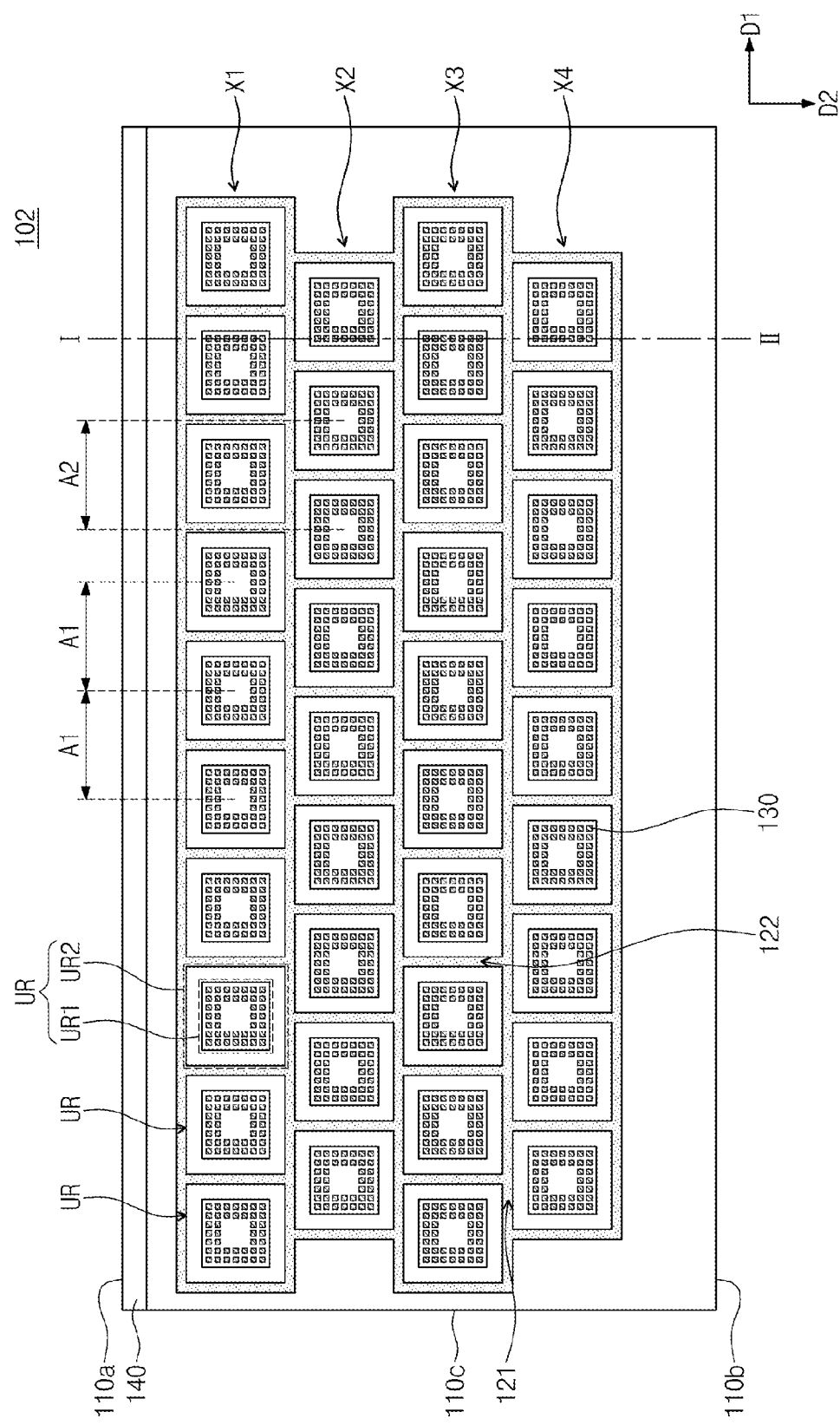
FIG. 12 is a plan view illustrating a substrate according to an embodiment.

FIG. 12 is a plan view illustrating a substrate according to an embodiment. In the present embodiment, the descriptions to the same elements as in the aforementioned embodiments will be omitted or mentioned briefly for the purpose of ease and convenience in explanation.

Referring to FIG. 12, a substrate 102 may include package unit regions UR provided on its one surface. The package unit regions UR may be arranged along a plurality of rows X1 to X4. Each of the rows X1 to X4 may include a plurality of package unit regions UR.

The package unit regions UR may be arranged in a staggered form (or a zigzag form). The package unit regions UR of one row of the rows X1 to X4 may be arranged offset from the package unit regions UR of another row of the rows X1 to X4 in a row direction D1. Arrangement of the package unit regions UR may be substantially the same as described with reference to FIG. 1A. For example, the package unit regions UR of odd-numbered rows X1 and X3 and the package unit regions UR of even-numbered rows X2 and X4 may be alternately arranged along the column direction D2. The package unit regions UR of the odd-numbered rows X1 and X3 may form first columns, and the package unit regions UR of the even-numbered rows X2 and X4 may form second columns. The second columns of the package unit regions UR of the even-numbered rows X2 and X4 may be laterally offset from the first columns of the package unit regions UR of the odd-numbered rows X1 and X3. Chip regions UR1 of the even-numbered rows X2 and X4 may be aligned with edge regions UR2 and second saw lines 122 of the odd-numbered rows X1 and X3 in the column direction D2.

In the present embodiment, the number of the package unit regions UR of an n+1-th row may be different from the number of the package unit region UR of an n-th row. For example, the number of the package unit regions UR of the second row X2 may be fewer than the number of the package unit regions UR of the first row X1. At this time, a difference between the numbers of the package unit regions UR of the first and second rows X1 and X2 may be 1. The shortest distance from a third side 110c of the substrate 102 to a first one of the package unit regions UR of the first row X1 may be less than the shortest distance from the third side 110c of the substrate 102 to a first one of the package unit regions UR of the second row X2.

The number of the package unit regions UR forming one row may be greater than a total number of the rows X1 to X4. The package unit regions UR may be arranged at regular intervals in the row direction D1. The package unit regions UR may be shifted toward a first side 110a of the one surface of the substrate 102. The arrangement of the chip regions UR1 may correspond to the arrangement of the package unit regions UR.

Figure 13:
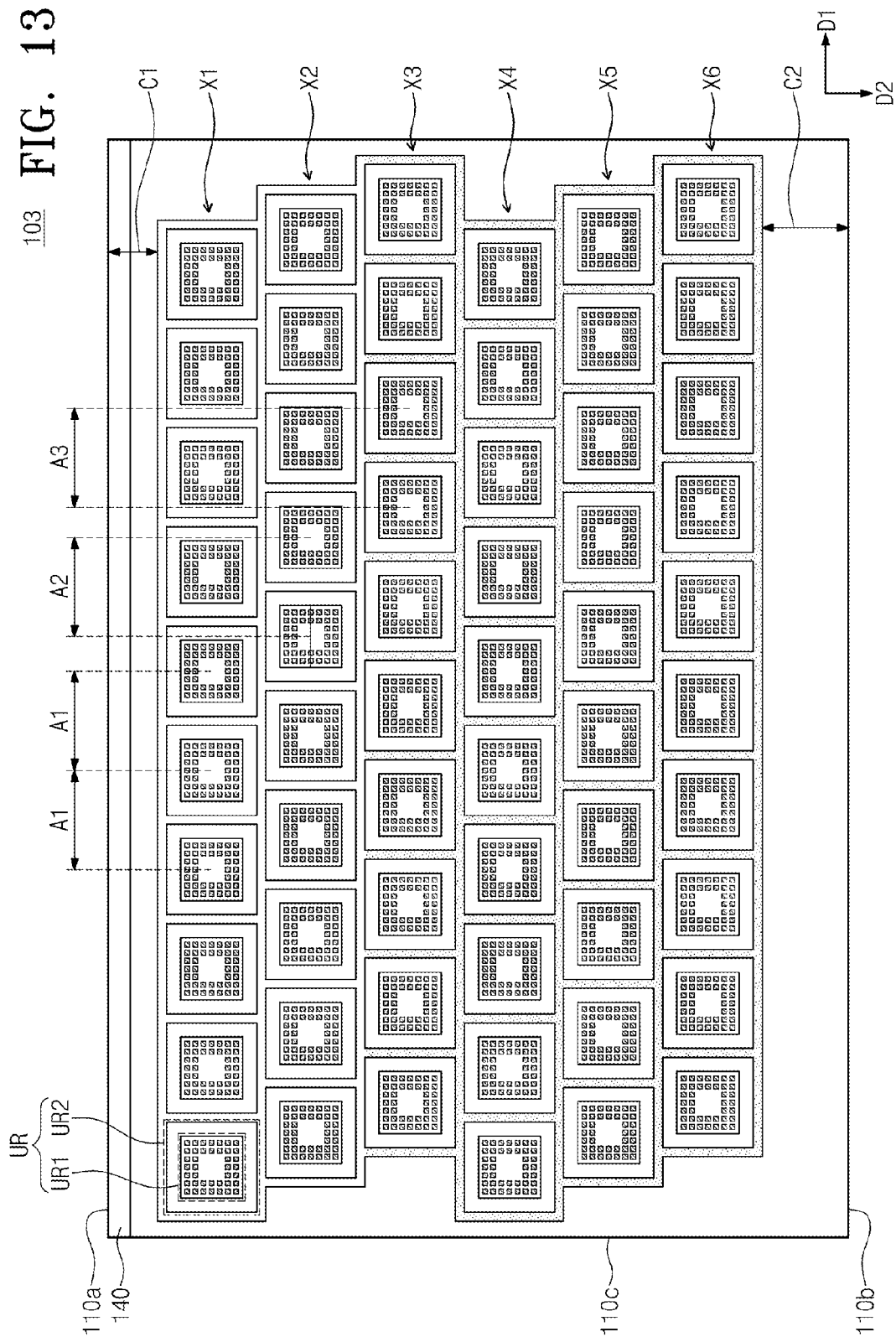
FIG. 13 is a plan view illustrating a substrate according to an embodiment.

FIG. 13 is a plan view illustrating a substrate according to an embodiment. In the present embodiment, the descriptions to the same elements as in the aforementioned embodiments will be omitted or mentioned briefly for the purpose of ease and convenience in explanation.

Referring to FIG. 13, package unit regions UR may be arranged along a plurality of rows X1 to X6 on one surface of a substrate 103. Each of the rows X1 to X6 may include a plurality of package unit regions UR. The package unit regions UR may be separated from each other by saw lines 121 and 122.

The package unit regions UR may be arranged in a staggered form (or a zigzag form). The package unit regions UR of one row of the rows X1 to X6 may be arranged offset from the package unit regions UR of another row of the rows X1 to X6 in a row direction D1. For example, the package unit regions UR of an n+1-th row and an n+2-th row may be arranged offset from the package unit region UR of an n-th row in the row direction D1, respectively, where "n" denotes a natural number. In addition, the package unit regions UR of the n+2-th row may be arranged offset from the package unit region UR of an n+1-th row in the row direction D1, respectively. The package unit regions UR of an n+3-th row and the package unit regions UR of the n-th row may form columns parallel to a column direction D2.

The package unit regions UR may be arranged at regular intervals. For example, distances A1, A2, or A3 between central points of the package unit regions UR of the same row may be equal to each other. The distance A3 between the central points of the package unit regions UR of the n+2-th row may be equal to the distance A1 between the central points of the package unit regions UR of the n-th row and the distance A2 between the central points of the package unit regions UR of the n+1-th row.

Positions of the n+1-th and n+2-th rows shifted from the n-th row may be controlled to control the number of the package unit regions UR of each of the rows X1 to X6. For example, the number of the package unit regions UR forming one of the rows X1 to X6 may be equal to the number of the package unit regions UR forming each of the others of the rows X1 to X6. In this case, a density of the package unit regions UP of the substrate 103 may be high. Alternatively, the number of the package unit regions UR of one of the rows X1 to X6 may be different from the number of the package unit regions UR of at least one of the others of the X1 to X6. All the package unit regions UR may be shifted toward a first side 110a of the one surface of the substrate 103. A distance C1 from the first side 110a of the one surface to the package unit regions UR of the first row X1 may be less than a distance C2 from a second side 110b of the one surface to the package unit regions UR of the last row X6. The chip regions UR1 may be arranged in the staggered form like the package unit regions UR. Each of the package unit regions UR may include a plurality of pads 130.

The semiconductor package may be manufactured using one of the substrates 100, 101, 102, and 103 including the package unit regions UR arranged as described with reference to FIGS. 1A and FIGS. 11 to 13. However, the arrangement of the package unit regions UR is not limited to the aforementioned embodiments. In other words, the arrangement of the package unit regions UR may be variously modified. For example, the package unit regions UR of n+1-th to n+a−1-th rows may be arranged offset from the package unit regions UR of the n-th row in the row direction D1, where "n" denotes a natural number and "a" denotes a natural number equal to or greater than 2. In addition, the package unit regions UR of an n+a-th row and the package unit regions UR of the n-th row may form columns parallel to the column direction D2.

Figure 14:
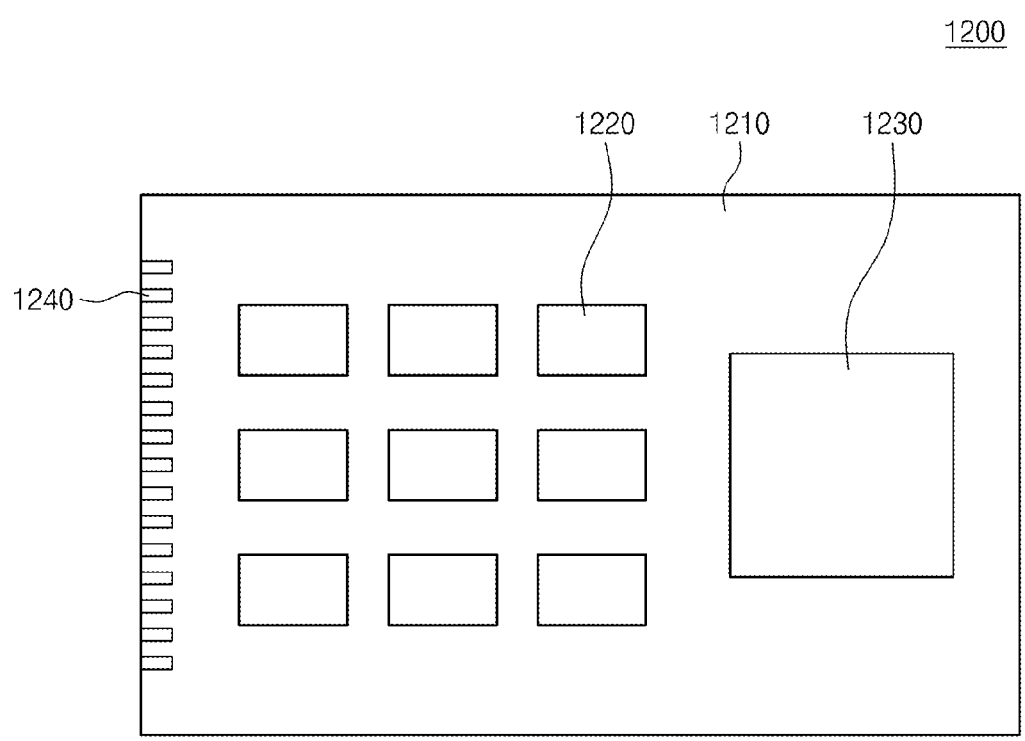
FIG. 14 is a diagram illustrating a package module including a semiconductor package according to embodiments.
Figure 15:
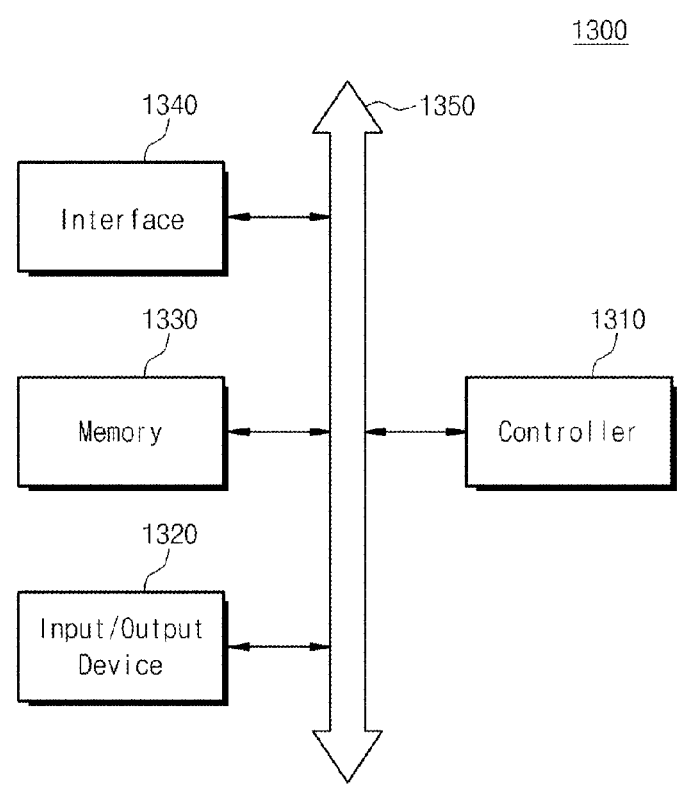
FIG. 15 is a schematic block diagram illustrating an example of an electronic system including a semiconductor package according to embodiments.
Figure 16:
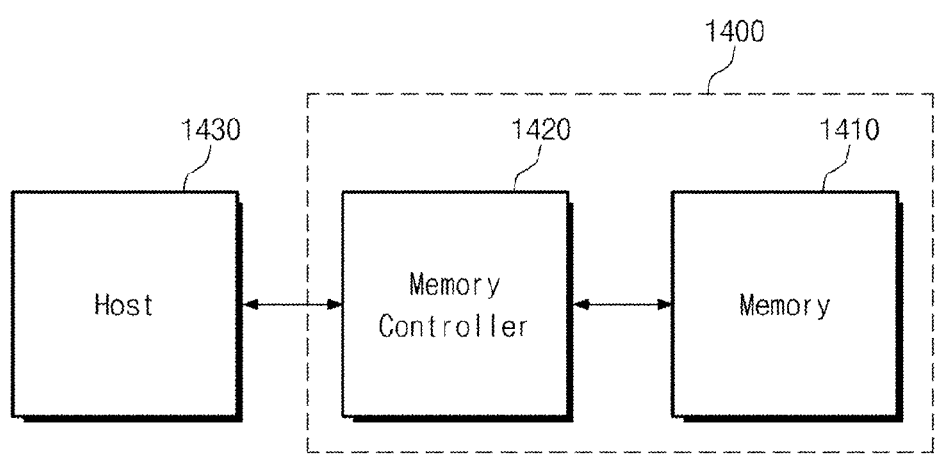
FIG. 16 is a schematic block diagram illustrating an example of a memory card including a semiconductor package according to embodiments.

FIG. 14 is a diagram illustrating a package module including a semiconductor package according to various embodiments. FIG. 15 is a schematic block diagram illustrating an example of an electronic system including a semiconductor package according to various embodiments. FIG. 16 is a schematic block diagram illustrating an example of a memory card including a semiconductor package according to various embodiments.

Referring to FIG. 14, a package module 1200 may include one or more first semiconductor devices 1220 and a second semiconductor device 1230 packaged using a quad flat package (QFP) technique. The semiconductor devices 1220 and 1230 may include at least one of semiconductor packages 1 to 3 according to the aforementioned embodiments. The package module 1200 may be connected to an external electronic device through external connection terminals 1240 provided on a side of a board 1210.

Referring to FIG. 15, an electronic system 1300 may include a controller 1310, an input/output (I/O) device 1320, and a memory device 1330. The controller 1310, the I/O device 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. At least one of the controller 1310 and the memory device 1330 may include at least one of the semiconductor packages 1 to 3 according to the aforementioned embodiments. The I/O device 1320 may include at least one of a keypad, a keyboard, or a display unit, such as a touch screen display. The memory device 1330 is a device storing data. The memory device 1330 may store data and/or commands executed by the controller 1310. The memory device 1330 may include at least one of a volatile memory device and a non-volatile memory device. In some embodiments, the memory device 1330 may include a flash memory device. For example, the flash memory device applied with the technique disclosed herein may be installed in an information processing system, such as a mobile device or a desk top computer. The flash memory device may be realized as solid state disks (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna or a wireless/cable transceiver. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic system 1300 may be used in a communication interface protocol such as a third generation communication system (e.g., CDMA, GSM, NADC, E-TDMA, WCDMA, CDMA2000).

Referring to FIG. 16, a memory card 1400 may include a non-volatile memory device 1410 and a memory controller 1420. The non-volatile memory device 1410 and the memory controller 1420 may store data or may read stored data. At least one of the memory device 1410 and the memory controller 1420 may include at least one of the semiconductor packages 1 to 3 according to the aforementioned embodiments. The memory controller 1420 may read data from/store data into the non-volatile memory device 1410 in response to read/write request of a host 1430.

According to various embodiments, the substrate may include the package unit regions which form the plurality of rows and are arranged in the staggered form (or the zigzag form). The formation of the molding layer may be sequentially performed from the first row to the last row. In one row, the flow speed of the molding compound on the edge regions may be greater than that of the molding compound on the chip regions. Since the package unit regions are arranged in the staggered form, the molding speed difference of one row may cancel the molding speed difference of another row. Thus, the molding speed differences may not be transferred to the last row. This means that the chip regions and the edge regions of the last row may be molded at the substantially same time. As a result, the void may not be formed in the molding layer, so the mechanical characteristics and reliability of the semiconductor packages may be improved.

While the systems, devices and techniques have been described with reference to particular embodiments, it will be apparent to those skilled in the art that various changes and modifications may be made without departing from the scope of the appended claims. Therefore, it should be understood that the above embodiments are not limiting, but illustrative. Thus, the scope of the appended claims are to be determined by the broadest permissible interpretation and their equivalents, and shall not be restricted or limited by the foregoing description.

What is claimed is:

1. A substrate for a semiconductor package, the substrate comprising:
   a surface; and
   a plurality of package unit regions arranged on the surface to form a plurality of rows in a row direction, package units regions of an n+1-th row being arranged offset in the row direction from package units of an n-th row, in which n denotes a natural number,
   wherein each package unit region comprises:
      a chip region having a first pad; and
      an edge region surrounding the chip region,
   wherein the first pad is separated apart from the edge region in a plan view,
   wherein a distance from the first side of the surface to the package unit regions of a first row of the plurality of rows is less than a distance from a second side of the surface to the package unit regions of a last row of the plurality of rows,
   wherein the first side is opposite to the second side,
   wherein the surface connects the first side and the second side,
   wherein the package unit regions are defined by saw lines, and wherein the saw lines are recessed from the surface.

2. The substrate of claim 1, wherein the package unit regions of the n-th row and the package unit regions of a row that is not adjacent to the n-th row form columns that are substantially perpendicular to the rows.

3. The substrate of claim 1, wherein a total number of package unit regions in a row comprises a first predetermined number and a total number of rows comprises a second predetermined number, the first predetermined number being greater than the second predetermined number.

4. The substrate of claim 1, wherein a total number of package unit regions of the n-th row is equal to a total number of package unit regions of a row adjacent to the n-th row.

5. The substrate of claim 1, wherein a total number of package unit regions of the n-th row is different from a total number of package unit regions of a row adjacent to the n-th row.

6. The substrate of claim 1, wherein the edge region has a second pad, wherein the second pad is laterally separated apart from the first pad.

7. A substrate for a semiconductor package, the substrate comprising:
   a first surface; and
   a plurality of package unit regions arranged on the first surface to form a plurality of rows that are substantially parallel to a row direction, the package unit regions of a row being respectively offset in the row direction from the package unit regions of an adjacent row, and each package unit region comprising a chip region and an edge region surrounding the chip region, wherein a distance from a first side of the first surface to the package unit regions of a first row of the plurality of rows is less than a distance from a second side of the first surface to the package unit regions of a last row of the plurality of rows,
   wherein the first side is opposite to the second side,
   wherein the surface connects to the first side and the second side,
   wherein the package unit regions are defined by saw lines, and
   wherein the saw lines are recessed from the first surface.

8. The substrate of claim 7, wherein a total number of package unit regions of one of the plurality of rows is equal to a total number of package unit regions of each of the others of the plurality of rows.

9. The substrate of claim 7, wherein the saw lines include first saw lines and second saw lines, the first saw lines extending in the row direction and the second saw lines extending in a column direction that intersects the row direction.

10. The substrate of claim 9, wherein the chip regions of a row are substantially aligned with the second saw lines respectively separating the package unit regions of the row from each other in the column direction.

11. The substrate of claim 9, further comprising:
a second surface opposite to the first surface; and
assistant saw lines on the second surface and disposed at positions corresponding to the first and second saw lines.

12. The substrate of claim 7, wherein a total number of the package unit regions of a row is greater than a total number of rows.

13. The substrate of claim 7, wherein each of the package unit regions further comprises:
a plurality of first pads provided on the chip region; and
a plurality of second pads provided on the edge region, wherein the first pads are separated apart from the second pads.

14. A semiconductor package substrate, comprising:
a surface; and
a plurality of package unit regions arranged on the surface to form a plurality of rows in a first direction, the package units regions in a first row being arranged offset in the first direction from the package units of a second row that is adjacent to the first row, and the package unit regions in the first row and the package unit regions in a row that is not adjacent to the first row form columns that are substantially perpendicular to the first direction,
wherein each package unit region comprises:
a chip region having a first pad; and
an edge region surrounding the chip region, wherein the first pad is separated apart from the edge region in a plan view,
wherein the package unit regions are defined by saw lines, and wherein the saw lines are recessed from the surface.

15. The substrate of claim 14, wherein a total number of package unit regions forming a row comprises a first predetermined number and a total number of rows comprises a second predetermined number, the first predetermined number being greater than the second predetermined number.

16. The substrate of claim 14, wherein the substrate further comprises a plurality of semiconductor chips, each semiconductor chip being received by a corresponding chip region.

17. The substrate of claim 14, wherein the surface comprises a first side and a second side, the second side being opposite the first side, and
wherein a distance from the first side to the package unit regions of a row that is adjacent to the first side being less than a distance from the second side to the package unit regions of a row that is adjacent to the second side.

18. The substrate of claim 17, further comprising a molding layer formed over and covering the semiconductor chips.

19. The substrate of claim 6, wherein each chip region is adapted to receive a lower semiconductor chip and an upper semiconductor chip on the lower semiconductor chip, each lower semiconductor chip being configured to include a molding layer comprising a plurality of through-molding-layer vias,
wherein the second pad is adapted to connect to the upper semiconductor chip, and
wherein each through-molding-layer via corresponding to the second pad.

20. The substrate of claim 7, wherein each chip region is adapted to receive a lower semiconductor chip and an upper semiconductor chip on the lower semiconductor chip, each lower semiconductor chip being configured to include a molding layer comprising a plurality of through-molding-layer vias,
wherein each of the package unit regions further comprises a plurality of pads provided on the chip region and on the edge region, the plurality of pads provided on the edge region being adapted to connect to the upper semiconductor chip, and
wherein each through-molding-layer via corresponding to a respective pad provided on the edge region.

21. The substrate of claim 14, wherein each chip region is adapted to receive a lower semiconductor chip and an upper semiconductor chip on the lower semiconductor chip, each lower semiconductor chip being configured to include a molding layer comprising a plurality of through-molding-layer vias.

* * * * *